United States Patent
Nakahara

(10) Patent No.: US 8,174,808 B2
(45) Date of Patent: May 8, 2012

(54) LOAD DRIVING DEVICE

(75) Inventor: Akihiro Nakahara, Kanagawa (JP)

(73) Assignee: Renesas Electronics Corporation, Kawasaki-shi, Kanagawa (JP)

( * ) Notice: Subject to any disclaimer, the term of this patent is extended or adjusted under 35 U.S.C. 154(b) by 330 days.

(21) Appl. No.: 12/314,363

(22) Filed: Dec. 9, 2008

(65) Prior Publication Data

US 2009/0154041 A1 Jun. 18, 2009

(30) Foreign Application Priority Data

Dec. 12, 2007 (JP) ................................ 2007-321101

(51) Int. Cl.
*H02H 3/00* (2006.01)
(52) U.S. Cl. ............ 361/84; 361/88; 361/91.1; 307/127
(58) Field of Classification Search .................... 361/84, 361/88, 82, 91.1, 100, 101; 307/127
See application file for complete search history.

(56) References Cited

U.S. PATENT DOCUMENTS

| | | | | |
|---|---|---|---|---|
| 5,821,796 A | * | 10/1998 | Yaklin et al. | 327/313 |
| 6,175,139 B1 | * | 1/2001 | Horiguchi et al. | 257/401 |
| 7,112,852 B2 | * | 9/2006 | Okushima | 257/360 |
| 7,550,878 B2 | * | 6/2009 | Komatsu et al. | 307/137 |
| 2009/0153225 A1 | * | 6/2009 | Nakahara | 327/419 |
| 2010/0013541 A1 | * | 1/2010 | Balboni | 327/427 |

FOREIGN PATENT DOCUMENTS

JP 2007-19812 1/2007

* cited by examiner

*Primary Examiner* — Patrick Salce
(74) *Attorney, Agent, or Firm* — McGinn IP Law Group, PLLC

(57) ABSTRACT

A load driving device according to an aspect of the present invention may includes an output transistor and a load connected in series between first and second power supply lines, a protection transistor connected between a gate of the output transistor and the second power supply line, the protection transistor turning on the output transistor when a polarity of a power supply connected between the first and second power supply lines is reversed, and a resistor arranged on a line, which supplies a voltage to a back gate of the protection transistor.

19 Claims, 18 Drawing Sheets

US 8,174,808 B2

LOAD DRIVING DEVICE

BACKGROUND

1. Field of the Invention

The present invention relates to a load driving device. More specifically, the invention relates to a load driving device including an output transistor that controls power supply to a load.

2. Description of Related Art

In order to supply power from a power supply to a load such as a functional circuit or a power device, a lot of load driving devices are employed. This type of load driving device includes an output transistor which is connected between the power supply and the load and serves as a switch. The load driving device supplies the power to the load or shuts off the power, according to a conduction state of the output transistor. The load driving device may be referred to as a high-side switch. An example of such a load driving device is disclosed in Japanese Unexamined Patent Application Publication No. 2007-19812.

A circuit diagram of a load driving device 100 disclosed in Japanese Unexamined Patent Application Publication No. 2007-19812 will be shown in FIG. 17. As shown in FIG. 17, the load driving circuit 100 includes a driver circuit 102, a switching N-type MOSFET (T101), and a controlling N-type MOSFET (T102). The controlling N-type MOSFET (T102) is provided between a gate of the switching N-type MOSFET (T101) and the ground. Then, the controlling N-type MOSFET (T102) is turned on or off, according to a driving signal s2 output from the driver circuit 102. When the controlling N-type MOSFET (T102) is turned off, a driving signal s1 output from the driver circuit 102 outputs a high-level signal. The switching N-type MOSFET (T101) is thereby turned on, so that power is supplied to the load 101. On the other hand, when the controlling N-type MOSFET (T102) is turned on, the gate of the switching N-type MOSFET (T101) is grounded to the ground. Thus, the switching N-type MOSFET (T101) is controlled to be turned off, so that power supply to the load 101 is shut off.

The controlling N-type MOSFET (T102) has a parasitic diode D102. An anode of the parasitic diode D102 is connected to the ground side, and a cathode of the parasitic diode D102 is connected to the gate side of the switching N-type MOSFET (T101). Thus, even when a dc power supply 103 is reversely connected, voltage is applied to the gate of the switching N-type MOSFET (T101) from the power supply 103 due to presence of the diode D102. Accordingly, the switching N-type MOSFET (T101) is turned on. For this reason, reverse connection current will not flow through a parasitic diode D101 of the switching N-type MOSFET (T101). Heat generation of the parasitic diode D101 may be thereby prevented. It means that in the load driving device 100, even when the power supply 103 is reversely connected, the switching N-type MOSFET T101 and other circuit component may be prevented from being damaged.

For the switching N-type MOSFET used as the output transistor in the load driving device, an N-type MOS transistor having a vertical structure formed on an N-type semiconductor substrate is often employed so as to realize high current capability. Further, in order to reduce the mounting area of the load driving device, it is preferable that the controlling N-type MOSFET (T102) be formed on the same semiconductor substrate as the switching N-type MOSFET (T101).

SUMMARY

However, the present inventor has found that the following problem. when the load driving device 100 is implemented as such a configuration, a parasitic transistor Q102 with a drain of the controlling N-type MOSFET (T102) configured as a collector thereof, with a back gate of the controlling N-type MOSFET (T102) configured as a base thereof, and with the N-type semiconductor substrate configured as an emitter thereof is formed. A drawing explaining a problem caused by the parasitic transistor Q102 will be shown in FIG. 18. FIG. 18 shows the controlling N-type MOSFET (T102) and the switching N-type MOSFET (T101) in the load driving device 100 formed on the N-type semiconductor substrate. FIG. 18 further shows a connection state where a polarity of the power supply 103 is reversed from that in a normal state.

As shown in FIG. 18, when the power supply 103 is reversely connected, a negative-polarity-side voltage VSS of the power supply 103 is supplied to the N-type semiconductor substrate, and a positive-polarity-side voltage VB of the power supply 103 is supplied to a ground terminal GND to which a ground voltage is supplied at a time of normal connection. In such a state, the parasitic transistor Q102 is turned on. Thus, electric charges to be supplied to the gate of the switching N-type MOSFET (T101) via the parasitic diode D102 are drawn by the parasitic transistor Q102. For this reason, a voltage at the gate of the switching N-type MOSFET (T101) assumes a value close to the ground voltage also when the power supply is reversely connected.

Accordingly, in the load driving device 100 in Japanese Unexamined Patent Application Publication No. 2007-19812, when the controlling N-type MOSFET (T102) and the switching N-type MOSFET (T101) are formed on the same N-type semiconductor substrate, the switching N-type MOSFET (T101) cannot be turned on at a time of reverse connection of the power supply 103. An excessive current therefore flows through the parasitic diode D101. It means that, in such a case in the load driving device 100 described in Japanese Unexamined Patent Application Publication No. 2007-19812, breakdown by heat generation of the switching N-type MOSFET (T101) cannot be prevented.

A load driving device according to an aspect of the present invention may includes an output transistor and a load connected in series between first and second power supply lines, a protection transistor connected between a gate of the output transistor and the second power supply line, the protection transistor turning on the output transistor when a polarity of a power supply connected between the first and second power supply lines is reversed, and a resistor arranged on a line, which supplies a voltage to a back gate of the protection transistor.

A load driving device according to another aspect of the present invention is the load driving device with elements formed on a semiconductor substrate of one conductivity type. The load driving device may includes an output transistor connected between a first power supply line and an output terminal, the output transistor driving a load connected between the output terminal and a second power supply line, a protection transistor connected between a gate of the output transistor and the second power supply line, the protection transistor turning on the output transistor when a polarity of a power supply connected between the first and second power supply lines is reversed, and a diffusion resistor arranged on a line, which supplies a voltage to a back gate of the protection transistor.

When the power supply is reversely connected in the load driving device according to the present invention, the voltage to be applied to the back gate of the protection transistor may be reduced by the resistor or the diffusion resistor. With this arrangement, a base voltage of a parasitic transistor formed when the power supply is reversely connected is reduced. The parasitic transistor is formed with a drain of the protection transistor configured as a collector of the parasitic transistor, with the back gate of the protection transistor configured as a base of the parasitic transistor, and with the semiconductor substrate of one conductivity type configured as an emitter of the parasitic transistor. Even when the power supply is reversely connected, this parasitic transistor may be turned off. In other words, the protection transistor may be effectively operated in the off state of the parasitic transistor. With this arrangement, in the load driving device according to the present invention, even if the protection transistor is formed on the semiconductor substrate of one conductivity type, the output transistor may be turned on at a time of reverse connection of the power supply. Heat generation of the output transistor may be thereby suppressed.

According to the load driving device of the present invention, even when the power supply is reversely connected, heat generation of the output transistor may be suppressed, and breakdown of the load driving device may be thereby prevented.

BRIEF DESCRIPTION OF THE DRAWINGS

The above and other exemplary aspects, advantages and features will be more apparent from the following description of certain exemplary embodiments taken in conjunction with the accompanying drawings, in which.

DETAILED DESCRIPTION OF THE EXEMPLARY EMBODIMENTS

Figure 1:
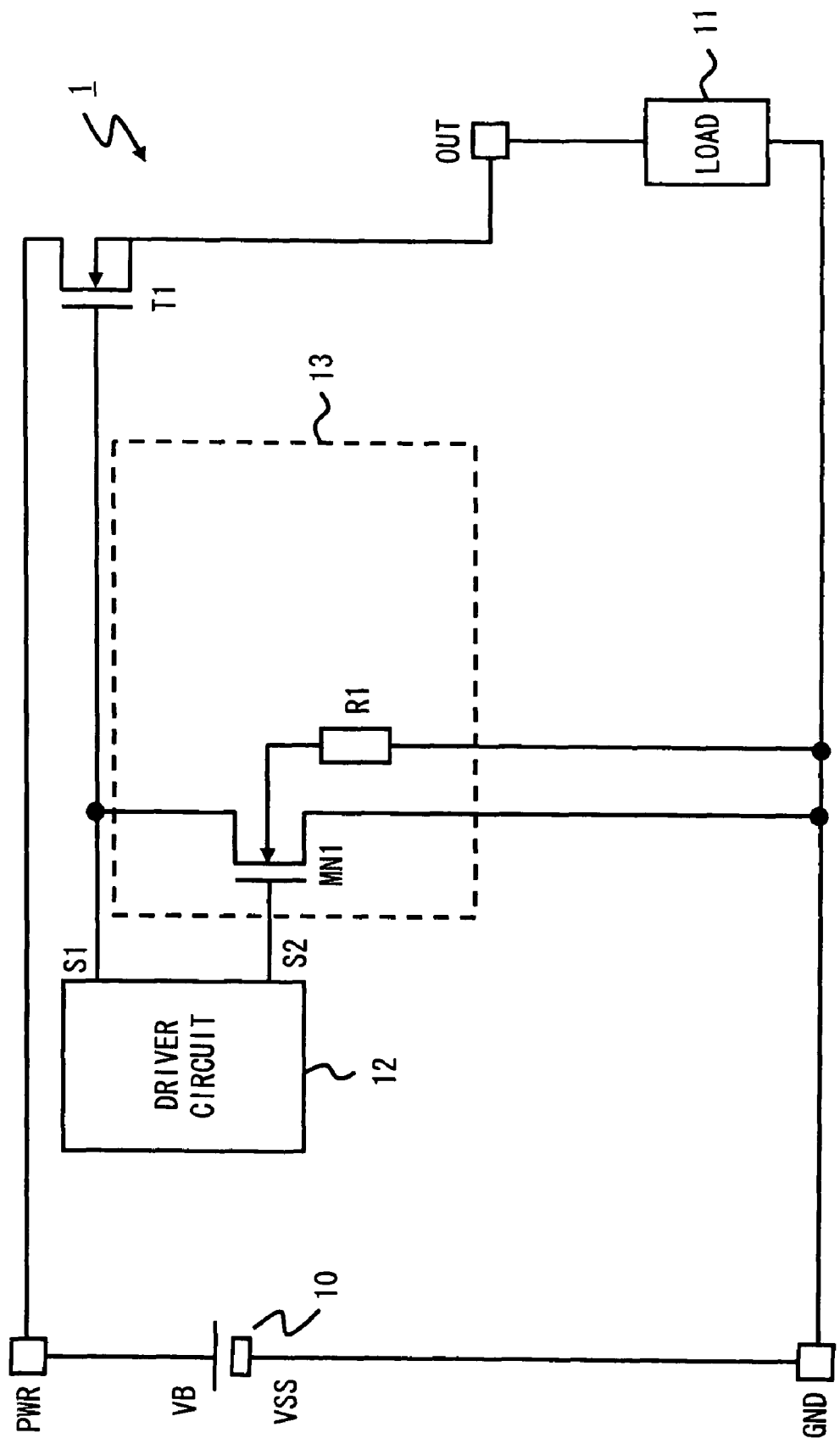
FIG. 1 is a circuit diagram of a load driving device according to a first idea before reaching a present invention.

Embodiments of the present invention will be described below with reference to drawings. FIG. 1 shows a circuit diagram of a load driving device 1 according to a first idea before reaching the present invention. As shown in FIG. 1, the load driving circuit 1 includes a power supply 10, a load 11, a driver circuit 12, a reverse connection protection circuit 13, an output transistor T1, a power supply terminal PWR, a ground terminal GND, and an output terminal OUT. The following description will be given, assuming that to the power supply terminal PWR, a first power supply line is connected, and to the ground terminal GND, a second power supply line is connected.

The power supply 10 is connected between the power supply terminal PWR and the ground terminal GND. At a time of normal connection, the power supply 10 supplies a positive-polarity-side voltage VB to the power supply terminal PWR and supplies a negative-polarity-side voltage VSS to the ground terminal GND. The load 11 is connected between the output terminal OUT and the ground terminal GND. The load 11 is a function circuit or a power device, for example, and is a power supply destination in the load driving device 1.

The driver circuit 12 is the control device of the load driving device 1. The driver circuit 12 supplies a control signal S1 to a gate of the output transistor T1, and supplies a control signal S2 to the reverse connection protection circuit 13. In this idea, it is assumed that the control signals S1 and S2 are signals that are opposite to each other in phase. The driver circuit 12 controls a conduction state of the output transistor T1 according to the control signals S1 and S2.

The reverse connection protection circuit 13 is connected between the gate of the output transistor T1 and the ground terminal GND, and is controlled by the driver circuit 12. The reverse connection protection circuit 13 draws electric charges from the gate of the output transistor T1 when the control signal S2 goes high. When the control signal S2 goes low, the reverse connection protection circuit 13 is turned off, and does not draw the electric charges from the gate of the output transistor T1.

More specifically, the reverse connection protection circuit 13 includes a protection transistor MN1 and a resistor (first resistor, e.g. a diffusion resistor R1). The protection transistor MN1 is an N-type MOS transistor formed on a semiconductor substrate of one conductive type (such as an N type) A drain of the protection transistor MN1 is connected to the gate of the output transistor T1. The control signal S2 is supplied to a gate of the protection transistor MN1, and a source of the protection transistor MN1 is connected to the ground terminal GND. In this idea, a discharging operation from the gate of the output transistor T1 at a time of normal operation is also performed, using the protection transistor MN1. The diffusion resistor R1 is formed in the N-type semiconductor substrate, using a diffusion region of another conductive type (such as a P type). In the diffusion resistor R1, for example, resistor connecting terminals are formed at both ends of the diffusion resistor R1 using P+ diffusion regions having a high impurity concentration, and a resistor portion is formed using a P− diffusion region having a low impurity concentration that connects the connecting terminals. One of the terminals of the diffusion resistor R1 is connected to a back gate of the protection transistor MN1, and the other of the terminals of the diffusion resistor R1 is connected to the ground terminal GND.

A drain of the output transistor T1 is connected to the power supply terminal PWR, and a source of the output transistor T1 is connected to the output terminal OUT. The control signal S1 is supplied to the gate of the output transistor T1. The output transistor T1 is turned on when the control signal S1 goes high. When the control signal S1 goes low, the output transistor T1 is turned off.

Next, an operation of the load driving device 1 when the power supply 10 is normally connected will be described. First, when the control signal S1 is high and the control signal S2 is low, the output transistor T1 is on. For this reason, the positive-polarity-side voltage VB output from the power supply 10 is supplied to the load 11 as power. On the other hand, when the control signal S1 is low and the control signal S2 is high, the output transistor T1 is off. For this reason, no power from the power supply 10 is supplied to the load 11, and a voltage at the output terminal OUT assumes substantially 0V. Almost no current flows through the back gate of the protection transistor MN1 when the load driving device 1 is normally operated. For this reason, substantially the same voltage as the negative-polarity-side voltage VSS of the power supply 10 is applied to the back gate of the protection transistor MN1 even via the diffusion resistor R1.

Next, the load driving device 1 when the power supply 10 is reversely connected will be described. When the power supply 10 is reversely connected, parasitic elements are formed in elements that constitute the reverse connection protection circuit 13. Then, electric charges flow into the gate of the output transistor T1 via the parasitic elements. A circuit diagram of the load driving device 1 when the power supply 10 is reversely connected will be shown in FIG. 2.

Figure 2:
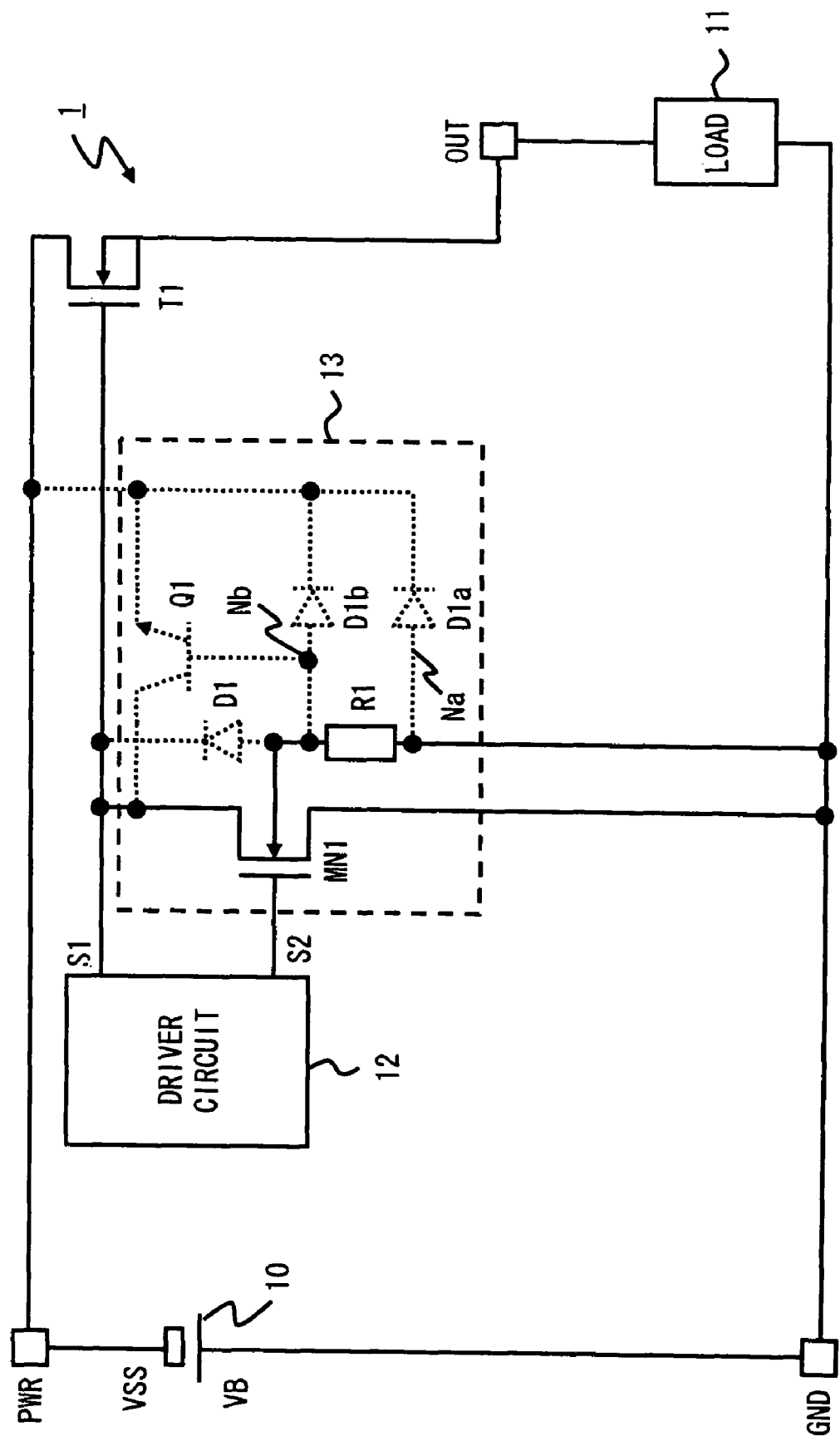
FIG. 2 is a circuit diagram of the load driving device when the power supply is reversely connected according to the first idea.

As shown in FIG. 2, when the power supply 10 is reversely connected, the positive-polarity-side voltage VB of the power supply 10 is applied to the ground terminal GND, and the negative-polarity-side voltage VSS of the power supply 10 is applied to the power supply terminal PWR. With this arrangement, parasitic diodes D1, D1a, and D1b and a parasitic transistor Q1 are formed in the reverse connection protection circuit 13 as the parasitic elements.

The back gate of the protection transistor MN1 serves as an anode of the parasitic diode D1, while a diffusion region of the protection transistor MN1 on the side connected to the gate of the output transistor T1 serves as a cathode of the parasitic diode D1. In other words, the anode of the parasitic diode D1 is connected to the back gate of the protection transistor MN1, and the cathode of the parasitic diode D1 is connected to the gate of the output transistor T1.

An anode of the parasitic diode D1a is connected to a terminal of the diffusion resistor R1 on the side of the ground terminal GND, and a cathode of the parasitic diode D1a is connected to the power supply terminal PWR. An anode of the parasitic diode D1b is connected to a terminal of the diffusion resistor R1 on the side of the back gate of the protection transistor MN1. A cathode of the parasitic diode D1b is connected to the power supply terminal PWR. A collector of the parasitic transistor Q1 is connected to the drain of the protection transistor MN1, a base of the parasitic transistor Q1 is connected to the back gate of the protection transistor MN1, and an emitter of the parasitic transistor Q1 is connected to the power supply terminal PWR.

Figure 3:
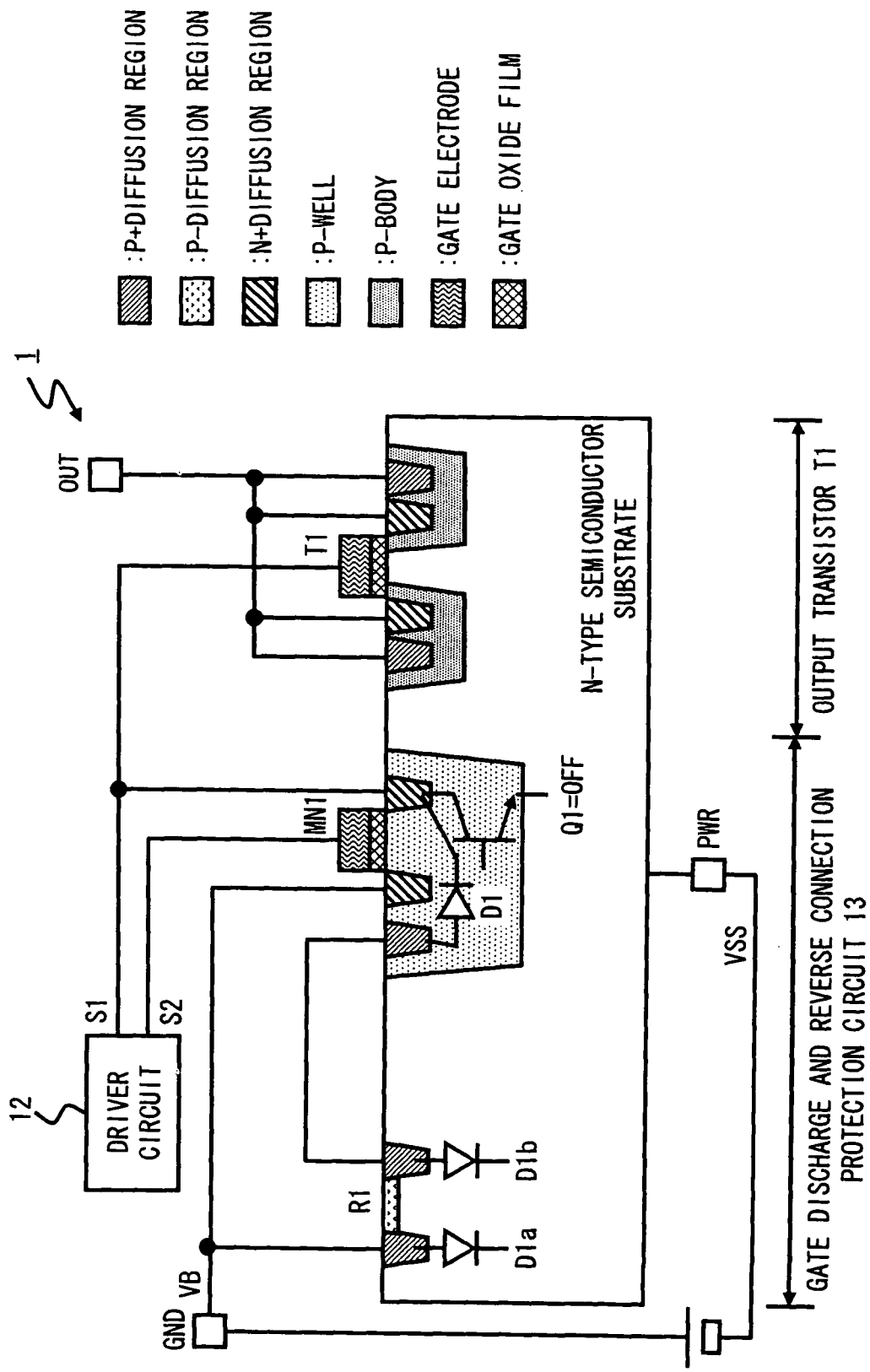
FIG. 3 is a sectional view of a reverse connection protection circuit and an output transistor, and explains about these parasitic elements according to the first idea.

In order to more specifically explain about these parasitic elements, a sectional view of the reverse connection protection circuit 13 and the output transistor T1 will be shown in FIG. 3. The sectional view shown in FIG. 3 shows an example where the reverse connection protection circuit 13 and the output transistor T1 are formed on one N-type semiconductor substrate.

As shown in FIG. 3, the diffusion resistor R1 is formed on the N-type semiconductor substrate, using the P-type diffusion region. In the diffusion resistor R1 in the example shown in FIG. 3, the resistor connecting terminals are formed at both ends of the diffusion resistor R1 using the P+ diffusion regions having the high impurity concentration, and the resistor portion is formed using the P− diffusion region having the low impurity concentration that connects the connecting terminals. The protection transistor MN1 includes a P well formed of a P-type semiconductor region in the N-type semiconductor substrate. The P well will be hereinafter referred to as the back gate of the protection transistor MN1 if necessary. Then, the protection transistor MN1 includes a P+ diffusion region and two N+ diffusion regions in the P well. The P+ diffusion region serves as a terminal that supplies a potential to the P well, and supplies a back gate voltage of the protection transistor MN1 to the P well. Each of the N+ diffusion regions forms a source or drain region of the protection transistor MN1. Then, a gate electrode is formed above an upper layer of the N-type semiconductor substrate that extends over the two N+ diffusion regions via a gate oxide film.

The output transistor T1 includes P-body regions formed of a P-type semiconductor in the N-type semiconductor substrate. The P-body regions will be hereinafter referred to as a back gate of the output transistor T1, if necessary. Then, an N+ diffusion region and a P+ diffusion region are included in each P-body region. The N+ diffusion region serves as the source of the output transistor T1. Then, a gate electrode is formed above a region that extends the N+ diffusion regions in the respective P-body regions formed to be separated to each other, via the gate oxide film. The output transistor T1 uses the N-type semiconductor substrate as the drain thereof. The P+ diffusion region formed in the P-body region supplies a back gate voltage to the P-body region.

Then, the parasitic diode D1 is formed between the back gate of the protection transistor MN1 and the N+ diffusion region of the protection transistor MN1 on the side connected to the gate of the output transistor T1. In this case, the back gate formed of the P-type semiconductor serves as the anode of the parasitic diode D1, and the N+ diffusion region formed of an N-type semiconductor serves as the cathode of the parasitic diode D1. The parasitic transistor Q1 is formed, with the back gate of the protection transistor MN1 configured as the base thereof, with the N-type semiconductor substrate configured as the emitter thereof, and with the N+ diffusion region of the protection transistor MN1 on the side connected to the gate of the output transistor T1 configured as the collector thereof. The parasitic diode D1a is formed, with the P+ diffusion region of the diffusion resistor R1 connected to the side of the ground terminal GND configured as the anode thereof and with the N-type semiconductor substrate configured as the cathode thereof. The parasitic diode D1b is formed, with the P+ diffusion region of the diffusion resistor R1 on the side connected to the back gate of the protection transistor MN1 as the anode thereof and with the N-type semiconductor substrate configured as the cathode thereof.

Figure 4:
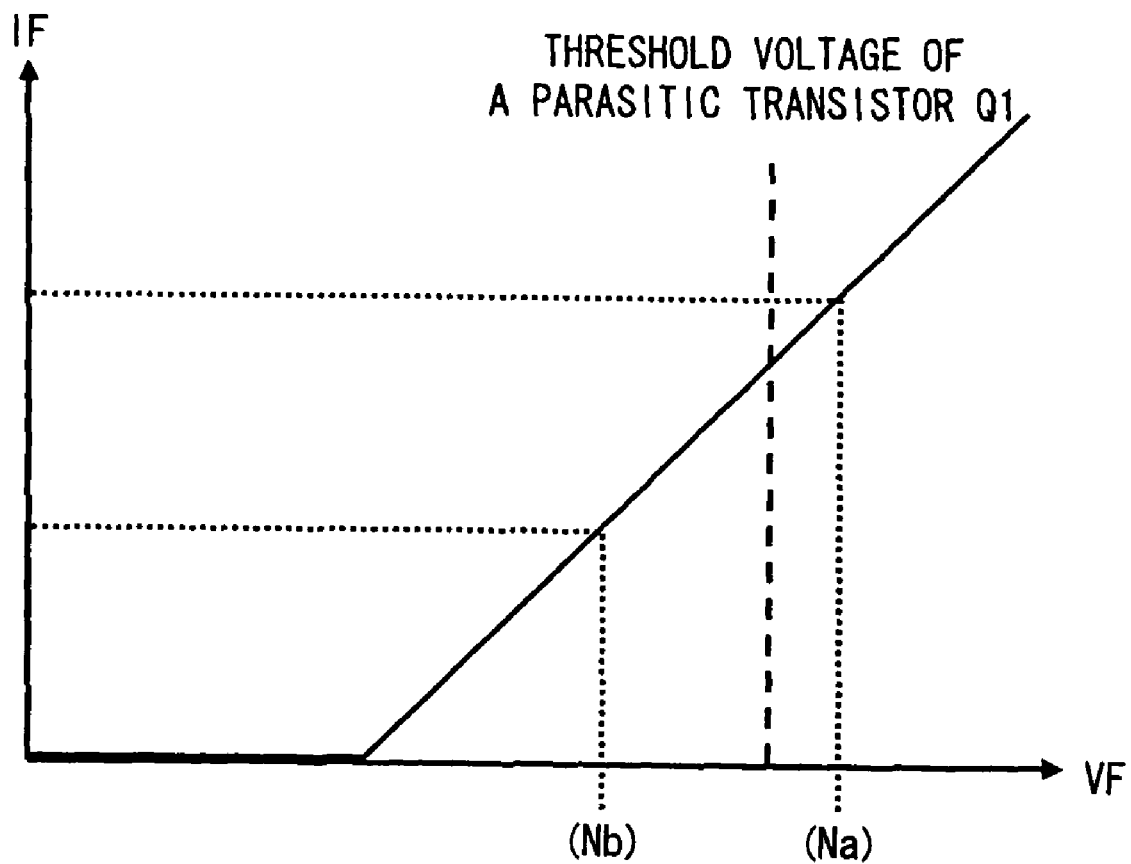
FIG. 4 is a graph showing a relationship between the current that flows through each of the parasitic diodes and the voltage generated on the cathode side of each of the parasitic diodes according to the first idea.

An operation of the load driving device 1 when the power supply 10 is reversely connected will be described. When the power supply 10 is reversely connected, electric charges flow into the gate of the output transistor T1 via the diffusion resistor R1 and the parasitic diode D1. In this case, current flows through the parasitic diodes D1a and D1b as well, in this idea. Then, a voltage generated on the cathode side of each of the parasitic diodes D1a and D1b when the current has flown through the parasitic diodes D1a and D1b will be described. FIG. 4 shows a graph showing a relationship between the current that flows through each of the parasitic diodes D1a and D1b and the voltage generated on the anode side of each of the parasitic diodes D1a and D1b.

In FIG. 4, a node on the anode side of the parasitic diode D1a is indicated by Na, while a node on the anode side of the parasitic diode D1b is indicated by Nb. The base of the parasitic transistor Q1 is connected to the node Nb. The cathodes of the parasitic diodes D1a and D1b are connected to a region common to the emitter of the parasitic transistor Q1. For this reason, the voltage generated between the anode and cathode of the parasitic diode D1b becomes a voltage between the base and the emitter of the parasitic transistor Q1.

As shown in FIG. 4, when the power supply 10 is reversely connected, the current flows through the parasitic diode D1a. Further, the current flows through the parasitic diode D1b via the diffusion resistor R1. For this reason, the voltage at the node Nb becomes lower than the voltage at the node Na due to the diffusion resistor R1 and the current that flows through the diffusion resistor R1. In the example shown in FIG. 4, while the voltage at the node Na is on the order of the positive-polarity-side voltage VB, the voltage at the node Nb is on the order of 0.5V. The threshold voltage of the parasitic transistor Q1 is herein higher than 0.5V. It means that when the voltage at the node Nb is on the order of 0.5V, the base-to-emitter voltage of the parasitic transistor Q1 cannot exceed the threshold voltage. For this reason, in this idea, the parasitic transistor Q1 maintains an off state even when the power supply 10 is reversely connected.

Accordingly, in this idea, electric charges that flow into the gate of the output transistor T1 via the diffusion resistor R1 and the parasitic diode D1 are not drawn by the parasitic transistor Q1. However, a gate voltage of the output transistor T1 when the power supply 10 is reversely connected is supplied through the parasitic diode D1, the gate voltage may not become higher than a voltage at the node Nb of about 0.5V at the most, so that the output transistor T1 may not turned on. That may not suppress heat generation of the output transistor T1 at a time of reverse connection of the power supply. Therefore, the present inventor has thought another solution.

First Exemplary Embodiment

In the load driving device 1 in the above mentioned idea, the protection transistor MN1 may not turn on at the time of reverse connection of the power supply. There has been another consideration as described below. A ground voltage of the load 11 is supplied from the ground terminal GND of the load driving device 1. For this reason, by drawing electric charges of the gate of the output transistor T1 by the reverse connection protection circuit 13 at a time of off operation of normal connection of the power supply, a source voltage of the output transistor T1 may be made substantially the same as the gate voltage of the output transistor T1. The output transistor T1 may be thereby turned off. However, the ground voltage may be supplied to the load 11 from a location separated from the load driving device. In such a case, a difference may be generated between the ground voltage supplied from the ground terminal GND of the load driving device and the ground voltage of the load 11. When the ground voltage difference is generated as described above, a source-to-gate voltage of the output transistor T1 cannot be reduced to such a level at which the output transistor T1 is turned off. An off state of the output transistor T1 cannot be controlled with reliability.

In a load driving device 2 in a first embodiment, a gate discharge circuit 14 that draws electric charges from the gate of the output transistor T1 is provided between the output terminal OUT and the gate of the output transistor T1. With this arrangement, in the load driving device 2, control over the off state of the output transistor T1 in normal operation is executed with reliability. Further, in the load driving device 2, a reverse connection protection circuit 15 that protects the load driving device 2 when the power supply 10 is reversely connected is provided independently.

Figure 5:
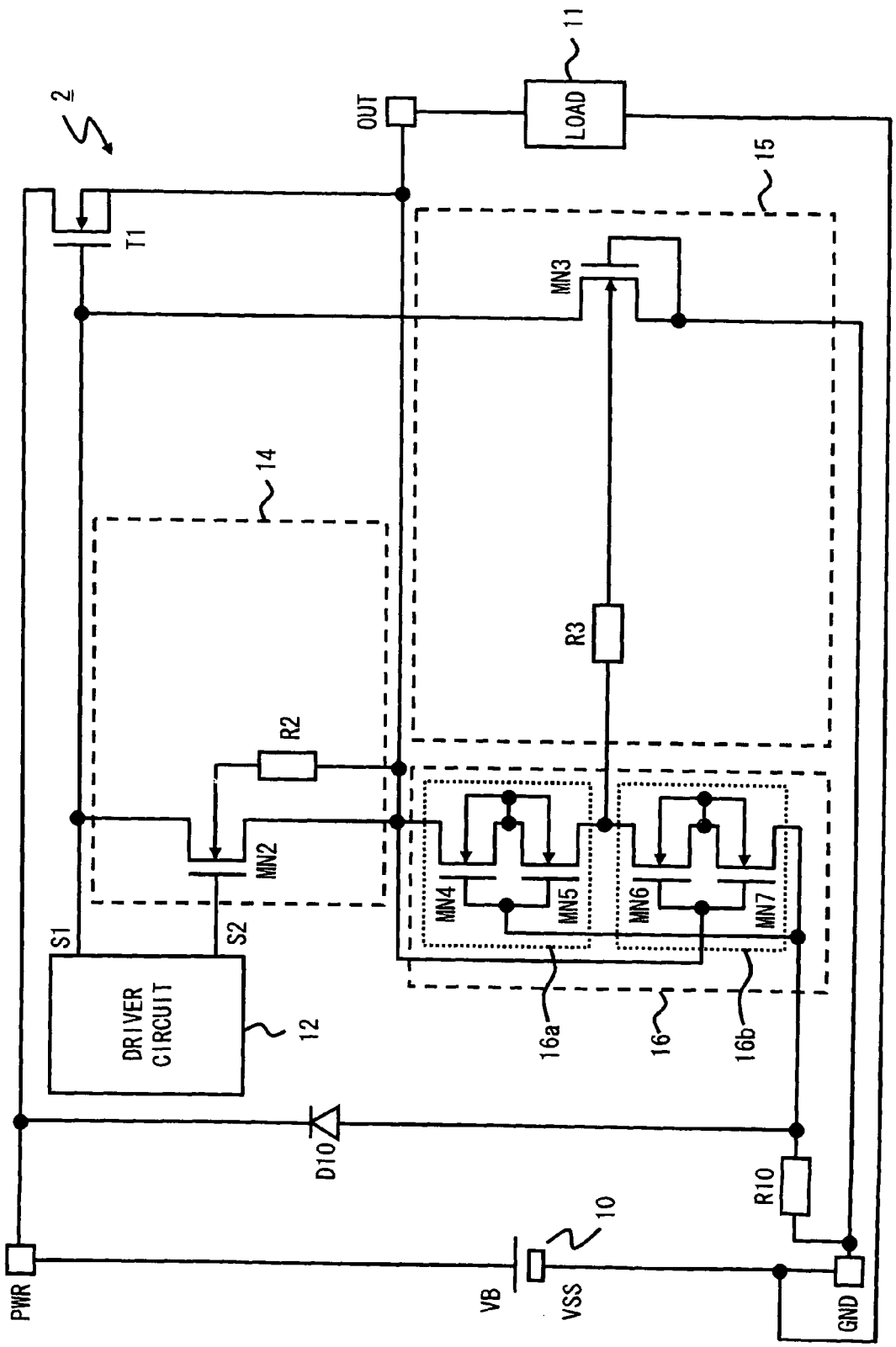
FIG. 5 is a circuit diagram of a load driving device according to a first exemplary embodiment of a present invention.

FIG. 5 shows a circuit diagram of the load driving device 2 according to the first embodiment. As shown in FIG. 5, the load driving device 2 includes the power supply 10, the load 11, the driver circuit 12, the gate discharge circuit 14, the reverse connection protection circuit 15, a back gate control circuit 16, the output transistor T1, a clamp diode D10, a current restriction resistor R10, the power supply terminal PWR, the ground terminal GND, and the output terminal OUT.

The power supply 10 is connected between the power supply terminal PWR and the ground terminal GND. At a time of normal connection, the power supply 10 supplies a positive-polarity-side voltage VB to the power supply terminal PWR and supplies a negative-polarity-side voltage VSS to the ground terminal GND. The load 11 is connected between the output terminal OUT and the ground terminal GND. The load 11 is a function circuit or a power device, for example, and is a power supply destination in the load driving device 2.

The driver circuit 12 is the control device of the load driving device 2. The driver circuit 12 supplies a control signal S1 to a gate of the output transistor T1, and supplies a control signal S2 to the gate discharge circuit 14. In this embodiment, it is assumed that the control signals S1 and S2 are signals that are opposite to each other in phase. The driver circuit 12 controls a conduction state of the output transistor T1 according to the control signals S1 and S2.

A drain of the output transistor T1 is connected to the power supply terminal PWR, and a source of the output transistor T1 is connected to the output terminal OUT. The control signal S1 is supplied to the gate of the output transistor T1. The output transistor T1 is turned on when the control signal S1 goes high. When the control signal S1 goes low, the output transistor T1 is turned off.

The gate discharge circuit 14 is connected between the gate of the output transistor T1 and the output terminal OUT, and is controlled by the driver circuit 12. The gate discharge circuit 14 draws electric charges from the gate of the output transistor T1 when a control signal S2 goes high. When the control signal S2 goes low, the gate discharge circuit 14 is turned off, and does not draw the electric charges from the gate of the output transistor T1.

More specifically, the gate discharge circuit 14 includes a discharge transistor MN2 and a second resistor (such as a diffusion resistor R2). The discharge transistor MN2 is an N-type MOS transistor formed on an N-type semiconductor substrate. A drain of the discharge transistor MN2 is connected to the gate of the output transistor T1, and the control signal S2 is supplied to the gate of the discharge transistor MN2. A source of the discharge transistor MN2 is connected to the output terminal OUT. The diffusion resistor R2 is formed in the N-type semiconductor substrate, using a P-type diffusion region. The diffusion resistor R2 has the same structure as the diffusion resistor R1 in the above mentioned idea. One terminal of the diffusion resistor R2 is connected to a back gate of the discharge transistor MN2, and the other terminal of the diffusion resistor R2 is connected to the output terminal OUT.

The reverse connection protection circuit 15 is connected between the gate of the output transistor T1 and the ground terminal GND. The reverse connection protection circuit 15 includes a protection transistor MN3 and a resistor (first transistor, such as a diffusion resistor R3). One of a source/drain of the protection transistor MN3 is connected to the gate of the output transistor T1, and the other of the source/drain of the protection transistor MN3 is connected to the ground terminal GND. Then, a gate of the protection transistor MN3 is connected to the other of the source/drain of the protection transistor MN3. It means that, when the power supply 10 is normally connected, the protection transistor MN3 has a diode-connected configuration, where the source of the protection transistor MN3 serves as an anode side terminal of a diode, and the drain of the protection transistor MN3 serves as a cathode terminal of the diode. A back gate of the protection transistor MN3 is connected to the back gate control circuit 16 via the diffusion resistor R3. When the power supply 10 is reversely connected, the drain of the protection transistor MN3 is connected to the ground terminal GND, and the source of the protection transistor MN3 is connected to the gate of the output transistor T1.

The back gate control circuit 16 is provided between the output terminal OUT and the ground terminal GND. The back gate control circuit 16 supplies a voltage based on a voltage at the ground terminal GND to the back gate of the protection transistor MN3 when the power supply 10 is normally connected. When the power supply 10 is reversely connected, the back gate control circuit 16 supplies a voltage based on a voltage at the power supply terminal PWR to the back gate of the protection transistor MN3. The back gate control circuit 16 includes a first switching portion 16a and a second switching portion 16b. The first switching portion 16a is not turned on in this embodiment. The second switching portion 16b supplies a negative-polarity-side voltage VSS of the power supply 10 to the back gate of the protection transistor MN3 when a positive-polarity-side voltage VB of the power supply 10 is supplied to the output terminal OUT. In this embodiment, the second switching portion 16b is connected to the ground voltage via the current restriction resistor R10, but only a little current flows through the back gate of the protection transistor MN3. For this reason, a voltage variation on a path from the ground terminal GND to the back gate of the protection transistor MN3 is negligibly small.

More specifically, the first switching portion 16a includes NMOS transistors MN4 and MN5. The NMOS transistors MN4 and MN5 are connected in series between the output terminal OUT and the diffusion resistor R3. Gates of the NMOS transistors MN4 and MN5 are both connected to the ground terminal GND via the current restriction resistor R10. Back gates of the NMOS transistors MN4 and MN5 are both connected to a connecting point between the NMOS transistors MN4 and MN5.

The second switching portion 16b includes NMOS transistors MN6 and MN7. The NMOS transistors MN6 and MN7 are connected in series between the diffusion resistor R3 and the ground terminal GND via the current restriction resistor R10. Gates of the NMOS transistors MN6 ands MN7 are both connected to the output terminal OUT. Back gates of the NMOS transistors MN6 and MN7 are both connected to a connecting point between the NMOS transistors MN6 and MN7. A source of the NMOS transistor MN7 is connected to the ground terminal GND via the current restriction resistor R10. The second switching portion 16b is turned on when a voltage difference between the source of the NMOS transistor MN7 and the output terminal OUT becomes not less than 0.7V (which is the forward bias voltage of a parasitic diode between the source and the back gate of an NMOS transistor MN7)+a threshold voltage VT (threshold voltage of the NMOS transistor MN6).

The current restriction resistor R10 and the clamp diode D10 are connected in series between the ground terminal GND and the power supply terminal PWR. Then, an anode of the clamp diode D10 is connected to the current restriction resistor R10, and a cathode of the clamp diode D10 is connected to the power supply terminal PWR.

Next, an operation of the load driving device 2 when the power supply is normally connected will be described. First, when a control signal S1 goes high and the control signal S2 goes low, the discharge transistor MN2 is turned off, and the output transistor T1 is turned on. For this reason, the positive-polarity-side voltage VB output from the power supply 10 is supplied to the load 11 as power. On the other hand, when the control signal S1 goes low and the control signal S2 goes high, the discharge transistor MN2 is turned on, and the discharge transistor MN2 draws electric charges from the gate of the output transistor T1 to the output terminal OUT. For this reason, a short-circuit occurs between the gate and a source of the output transistor due to the discharge transistor MN2, so that the output transistor T1 is turned off. For this reason, no power from the power supply 10 is supplied to the load 11, and a voltage at the output terminal OUT assumes substantially 0V. Almost no current flows through the back gate of the discharge transistor MN2 when the load driving device 1 is normally operated. For this reason, substantially the same voltage as the voltage at the output terminal OUT is applied to the back gate of the discharge transistor MN2 even via the diffusion resistor R2.

When the power supply 10 is normally connected, a diode-connected transistor formed by the protection transistor MN3 that is coupled between the gate of the output transistor T1 and the ground terminal GND is not turned on. Thus, the protection transistor MN3 is inoperative. Further, since the second switching portion 16b is turned on, the ground voltage is applied to the back gate of the protection transistor MN3 via the diffusion resistor R3 and the current restriction resistor R10.

Next, the load driving device 2 when the power supply 10 is reversely connected will be described. When the power supply 10 is reversely connected, parasitic elements are formed in elements that constitute the gate discharge circuit 14 and the reverse connection protection circuit 15. However, electric charges flow into the gate of the output transistor T1 through the reverse connection protection circuit 15 and are effectively prevented from being discharged through the parasitic elements. A circuit diagram of the load driving device 2 when the power supply 10 is reversely connected will be shown in FIG. 6.

Figure 6:
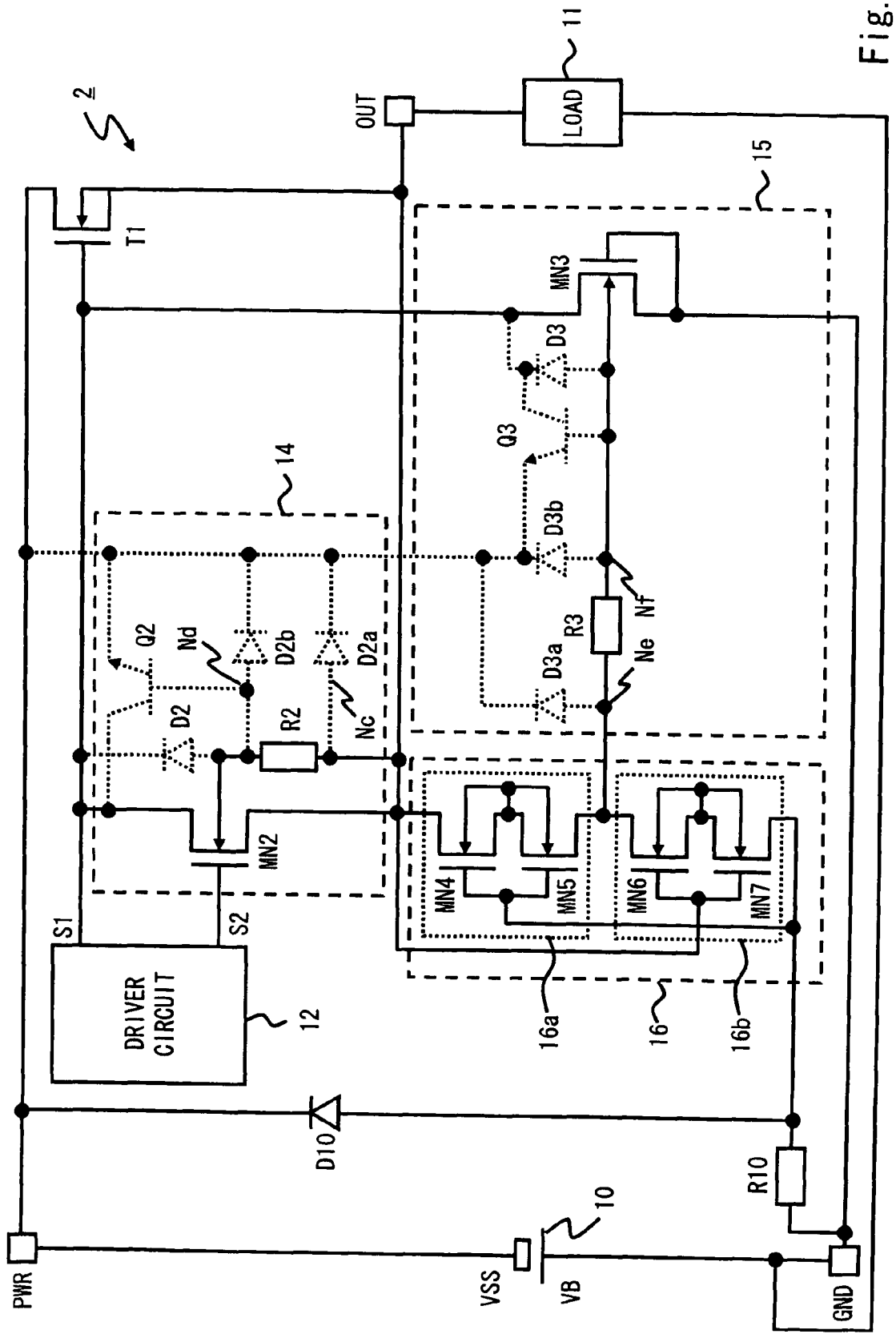
FIG. 6 is a circuit diagram of the load driving device when the power supply is reversely connected according to the first exemplary embodiment.

As shown in FIG. 6, when the power supply 10 is reversely connected, the positive-polarity-side voltage VB of the power supply 10 is applied to the ground terminal GND, and the negative-polarity-side voltage VSS of the power supply 10 is applied to the power supply terminal PWR. With this arrangement, parasitic diodes D2, D2a, and D2b and a parasitic transistor Q2 is formed in the gate discharge circuit 14 as parasitic elements. Further, parasitic diodes D3, D3a, D3b, and a parasitic transistor Q3 are formed in the reverse connection protection circuit 15 as parasitic elements.

The back gate of the discharge transistor MN2 serves as an anode of the parasitic diode D2, and a diffusion region of the discharge transistor MN2 on the side connected to the gate of the output transistor T1 serves as a cathode of the parasitic diode D2. In other words, the anode of the parasitic diode D2 is connected to the back gate of the discharge transistor MN2, and the cathode of the parasitic diode D2 is connected to the gate of the output transistor T1.

An anode of the parasitic diode D2a is connected to a terminal of the diffusion resistor R2 on the side of the output terminal OUT, and a cathode of the parasitic diode D2a is connected to the power supply terminal PWR. An anode of the parasitic diode D2b is connected to a terminal of the diffusion resistor R2 on the side of the back gate of the discharge transistor MN2, and a cathode of the parasitic diode D2b is connected to the power supply terminal PWR. A collector of the parasitic diode Q2 is connected to the drain of the discharge transistor MN2, and a base of the parasitic diode Q2 is connected to the back gate of the discharge transistor MN2, and an emitter of the parasitic transistor Q2 is connected to the power supply terminal PWR.

The back gate of the protection transistor MN3 serves as an anode of the parasitic diode D3, and a diffusion region of the protection transistor MN3 on the side connected to the gate of the output transistor T1 serves as a cathode of the parasitic diode D3. In other words, the anode of the parasitic diode D3 is connected to the back gate of the protection transistor MN3, and the cathode of the parasitic diode D3 is connected to the gate of the output transistor T1.

An anode of the parasitic diode D3a is connected to a terminal of the diffusion resistor R3 on the side of the back gate control circuit 16, and a cathode of the parasitic diode D3a is connected to the power supply terminal PWR. An anode of the parasitic diode D3b is connected to a terminal of the diffusion resistor R3 on the side of the back gate of the protection transistor MN3, and a cathode of the parasitic diode D3b is connected to the power supply terminal PWR. A collector of the parasitic diode Q3 is connected to the diffusion region of the protection transistor MN3 on the side connected to the gate of the output transistor T1, and a base of the parasitic diode Q3 is connected to the back gate of the protection transistor MN3, and an emitter of the parasitic transistor Q3 is connected to the power supply terminal PWR.

Figure 7:
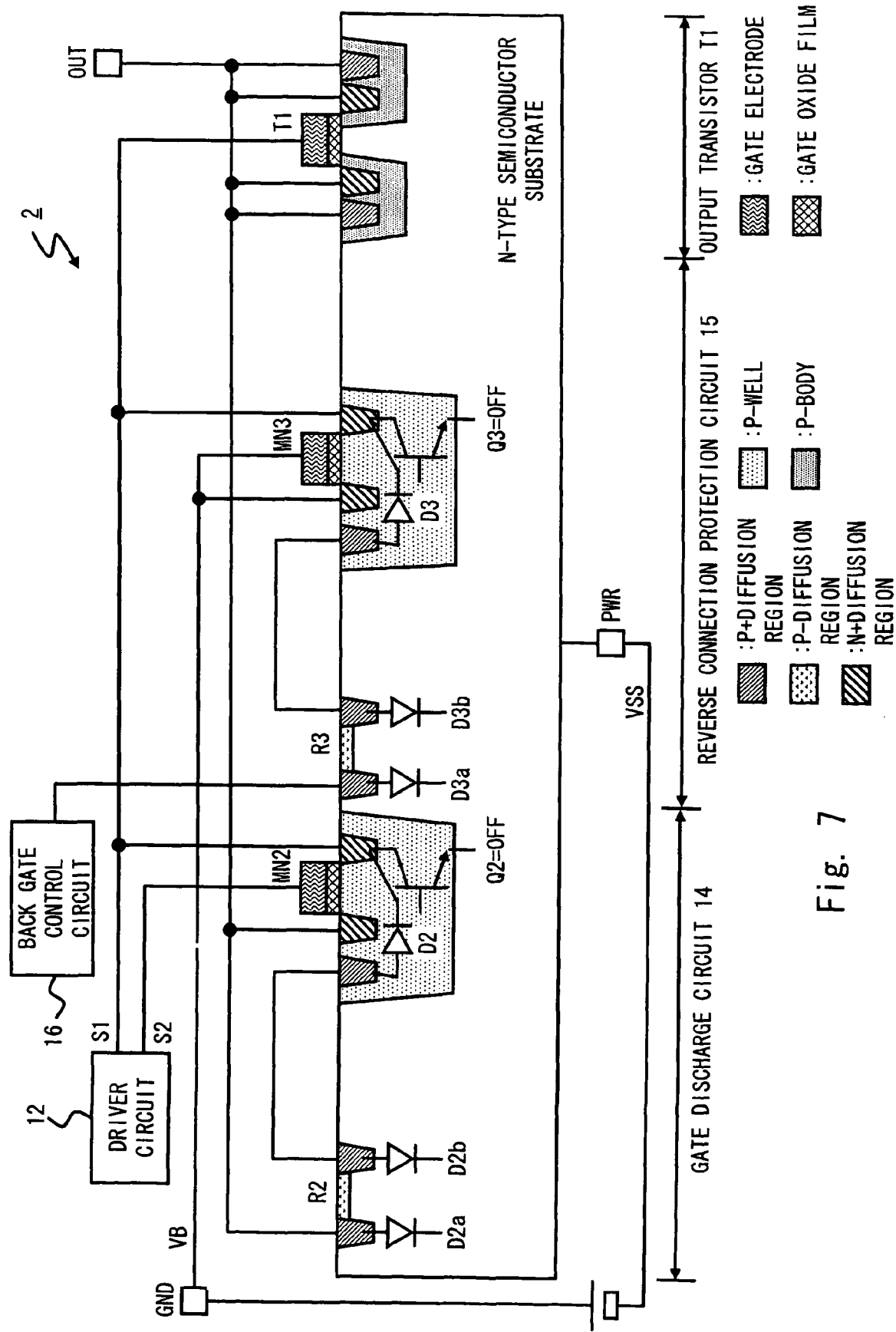
FIG. 7 is a sectional view of a reverse connection protection circuit and an output transistor, and explains about these parasitic elements according to the first exemplary embodiment.

In order to more specifically describe these parasitic elements, a sectional view of the gate discharge circuit 14, reverse connection protection circuit 15, and output transistor T1 will be shown in FIG. 7. In the sectional view shown in FIG. 7, an example where the gate discharge circuit 14, reverse connection protection circuit 15, and output transistor T1 are formed on one N-type semiconductor substrate is shown.

As shown in FIG. 7, each of the gate discharge circuit 14 and the reverse connection protection circuit 15 is formed of elements of substantially the same structures as those of the reverse connection protection circuit 13 shown in FIG. 3. Further, the output transistor is the same as the output transistor T1 shown in FIG. 3.

An operation of the load driving device 2 when the power supply 10 is reversely connected will be described. When the power supply 10 is reversely connected, the positive-polarity-side voltage VB is applied to the gate of the protection transistor MN3. Thus the protection transistor MN3 is turned on. However, there is a transition period before the output transistor T1 turns on. During the transition period, a voltage at the output terminal OUT becomes the positive-polarity-side voltage VB, and then becomes a forward voltage (such as approximately 0.7V) of the parasitic diode formed in the output transistor T1 because the parasitic diode thereof is forward biased, instantaneously. After that, the output transistor T1 turns on, a voltage at the output terminal OUT assumes substantially 0V.

When the power supply 10 is reversely connected, electric charges may flow into the gate of the output transistor T1 via the diffusion resistor R2 and the parasitic diode D2 before the protection transistor MN3 turns on, instantaneously. Then, a voltage generated on the cathode side of each of the parasitic diodes D2a and D2b when the current has flown through the parasitic diodes D2a and D2b will be described.

In FIG. 6, a node on the anode side of the parasitic diode D2a is indicated by Nc, while a node on the anode side of the parasitic diode D2b is indicated by Nd. The base of the parasitic transistor Q2 is connected to the node Nd. The cathodes of the parasitic diodes D2a and D2b are connected to a region common to the emitter of the parasitic transistor Q2. For this reason, the voltage generated between the anode and cathode of the parasitic diode D2b becomes a voltage between the base and the emitter of the parasitic transistor Q2.

As shown in FIG. 6, when the power supply 10 is reversely connected, the current flows through the parasitic diode D2a. Further, the current flows through the parasitic diode D2b via the diffusion resistor R2. For this reason, the voltage at the node Nd becomes lower than the voltage at the node Nc due to the diffusion resistor R2 and the current that flows through the diffusion resistor R2. While the voltage at the node Nc is on the order of the positive-polarity-side voltage VB, the voltage at the node Nd is on the order of 0.5V by a voltage drop across the diffusion resistor R2. The threshold voltage of the parasitic transistor Q2 is herein higher than 0.5V. It means that when the voltage at the node Nd is on the order of 0.5V, the base-to-emitter voltage of the parasitic transistor Q2 cannot exceed the threshold voltage. For this reason, in this embodiment, current pathway between the gate of the output transistor and the power supply terminal PWR through the parasitic transistor Q2 is not made.

A voltage applied to the output terminal OUT is lowered to on the order of about 0.7V by the forward biased parasitic diode of the output transistor T1, a voltage applied at the node Nc is also lowered. Thus a voltage applied at the node Nd is not exceed on the order of 0.5V, electric charges flow into the gate of the output transistor T1 via the protection transistor MN3 are not drawn through the parasitic transistor Q2. Thereby the output transistor T1 effectively turns on.

On the other hand, the clamp diode D10 is biased in a forward direction in this embodiment. Thus, current flows from the ground terminal GND to the power supply terminal PWR via the current restriction resistor R10 and the clamp diode D10. In other words, a diode voltage (such as approximately 0.7V) of the clamp diode D10 is generated at a node between the current restriction resistor R10 and the clamp diode D10. A threshold voltage of the first switching portion 16a is higher than the diode voltage of about 0.7V, the first switching portion 16a is maintained to be turned off.

When a voltage applied at the output terminal OUT is equal to or higher than a threshold voltage of the second switching portion 16b, the second switching portion 16b is turned on, the diode voltage of about 0.7V is applied at a node Ne (node on the anode side of parasitic diode D3a). In this case, a voltage on the order of 0.5V at the most is generated at a node Nf (node on the anode side of the parasitic diode D3b) by a voltage drop across the diffusion resistor R3, similar to the diffusion resister R2 and the parasitic diodes D2a and D2b.

Thereby the parasitic transistor Q3 does not turn on. Accordingly, electric charges that flow into the gate of the output transistor T1 via the protection transistor MN3 are not drawn by the parasitic transistor Q3.

When a voltage applied at the output terminal OUT is lower than the threshold voltage of the second switching portion 16b, the second switching portion 16b is turned off. In other words, the first switching portion 16a and the second switching portion 16b in the back gate control circuit 16 are both turned off. Therefore, a voltage of about 0.7V at the most, which is a voltage between that of the output terminal OUT and that of the anode of the clamp diode D10, is applied at the anode of the parasitic diode D3a. However, a voltage on the order of 0.5V at the most is generated at the anode of the parasitic diode D3b by a voltage drop across the diffusion resistor R3, Thereby the parasitic transistor Q3 does not turn on. Accordingly, electric charges that flow into the gate of the output transistor T1 via the protection transistor MN3 are not drawn by the parasitic transistor Q3.

When the power supply 10 is reversely connected, this voltage on the order of 0.5V at the most is applied to the back gate of the transistor MN3. For this reason, a back gate voltage of the protection transistor MN3 is substantively low level. When the power supply 10 is reversely connected, a potential higher than a gate voltage of the output transistor T1 is applied to a ground potential GND of the protection transistor MN3. Thus, the protection transistor MN3 is successfully turned on. Accordingly, in this embodiment, a voltage obtained by subtracting an on voltage generated at the protection transistor MN3 from the positive-polarity-side voltage VB of the power supply 10 applied to the ground terminal GND is applied to the gate of the output transistor T1. Then, the output transistor T1 is maintained to be turned on.

When the output transistor T1 is turned on, a voltage substantially equal to 0V is applied at the output terminal OUT. A voltage at the node Nd is lowered to substantially equal to 0V, the off state of the parasitic transistor Q2 is maintained. Further, a voltage applied at the node Ne is maintained lower than the diode voltage of about 0.7V applied at the anode of the clamp diode D10, a voltage applied at the node Nf is maintained on the order of 0.5V. Thereby the off state of the parasitic transistor Q3 is maintained.

The parasitic transistor Q2 formed in the discharge transistor MN2 is maintained an off state through the use of the diffusion resistor R2 and the parasitic diodes D2a and D2b of the diffusion resistor R2. Further, the parasitic transistor Q3 is formed in the protection transistor MN3 is maintained an off state through the use of the diffusion resistor R3 and the parasitic diodes D3a and D3b of the diffusion resistor R3.

Accordingly, in this embodiment, when the power supply 10 is reversely connected, the diode-connected protection transistor MN3 is forwardly biased. The protection transistor MN3 thereby turns on. Thus, the gate voltage of the output transistor T1 assumes a voltage value close to the positive-polarity-side voltage VB of the power supply 10 when the power supply 10 is reversely connected. Then, the output transistor T1 is turned on. Further, each of the parasitic transistors Q2 and Q3 formed when the power supply 10 is reversely connected maintains the off state. Thus, the output transistor T1 is not turned off by the parasitic transistor Q2 and the parasitic transistor Q3.

As described above, the load driving device 2 in the first embodiment includes the gate discharge circuit 14 between the gate of the output transistor T1 and the output terminal OUT. With this arrangement, even if the ground voltage of the load 11 is different from the voltage at the ground terminal GND of the load driving device 2, a short circuit may be caused between the source and the gate of the output transistor T1 when the output transistor T1 is turned off in normal operation. The off state of the output transistor T1 may be thereby controlled with reliability. In other words, in the load driving device 2, control over the off state of the output transistor T1 at a time of normal operation may be performed with reliability, irrespective of a connection state of the load 11.

Further, the diffusion resistor R2 is provided together with the discharge transistor MN2, and the diffusion resistor R3 is provided with the protection transistor MN3. The off states of the parasitic transistors Q2 and Q3 when the power supply 10 is reversely connected may be thereby maintained, as in the above mentioned idea. With this arrangement, in the load driving device 2, the diode-connected protection transistor MN3 coupled between the ground terminal GND and the gate of the output transistor T1 with may be turned on reliably, when the power supply 10 is reversely connected. In other words, in the load driving device 2, the output transistor T1 is turned on via the protection transistor MN3 when the power supply 10 is reversely connected. Breakdown of the load driving device 2 due to overheating may be thereby prevented.

Second Exemplary Embodiment

Figure 8:
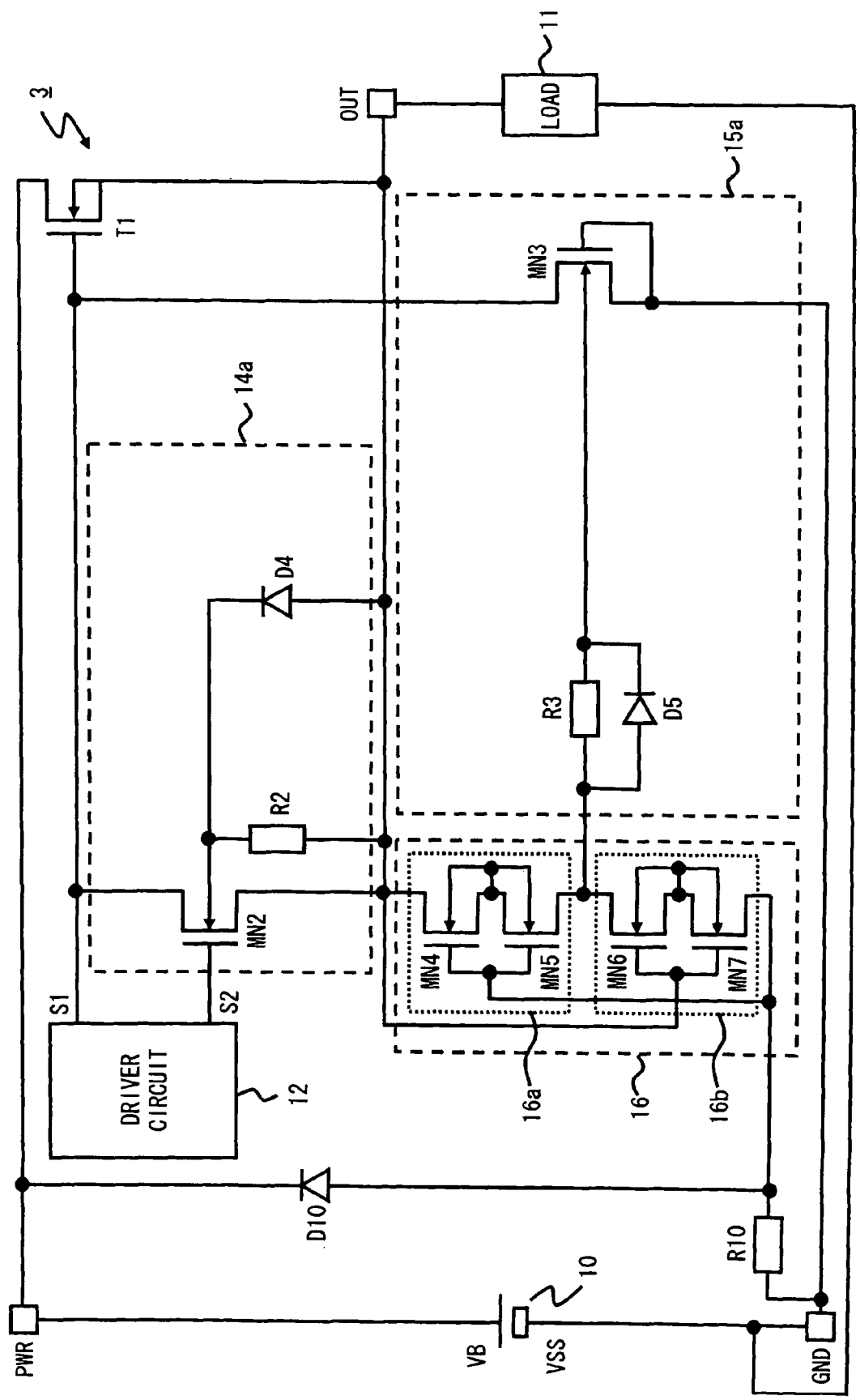
FIG. 8 is a circuit diagram of a load driving device according to a second exemplary embodiment of a present invention.

A circuit diagram of a load driving device 3 according to a second embodiment will be shown in FIG. 8. As shown in FIG. 8, the load driving device 3 includes a gate discharge circuit 14a and a reverse connection protection circuit 15a, which are respectively variations of the gate discharge circuit 14 and the reverse connection protection circuit 15 in the first embodiment. In the load driving device 3, by assigning same reference numerals to components that are the same as those of the load driving device 2, description of the components will be omitted.

The gate discharge circuit 14a is obtained by adding a diode D4 connected in parallel with the diffusion resistor R2 to the gate discharge circuit 14. The reverse connection protection circuit 15a is obtained by adding a diode D5 connected in parallel with the diffusion resistor R3 to the reverse connection protection circuit 15. The diodes D4 and D5 are not forwardly biased when the power supply 10 is normally connected. For this reason, an operation of the load connection circuit 3 when the power supply 10 is normally connected is substantially the same as that of the load driving circuit 2.

Figure 9:
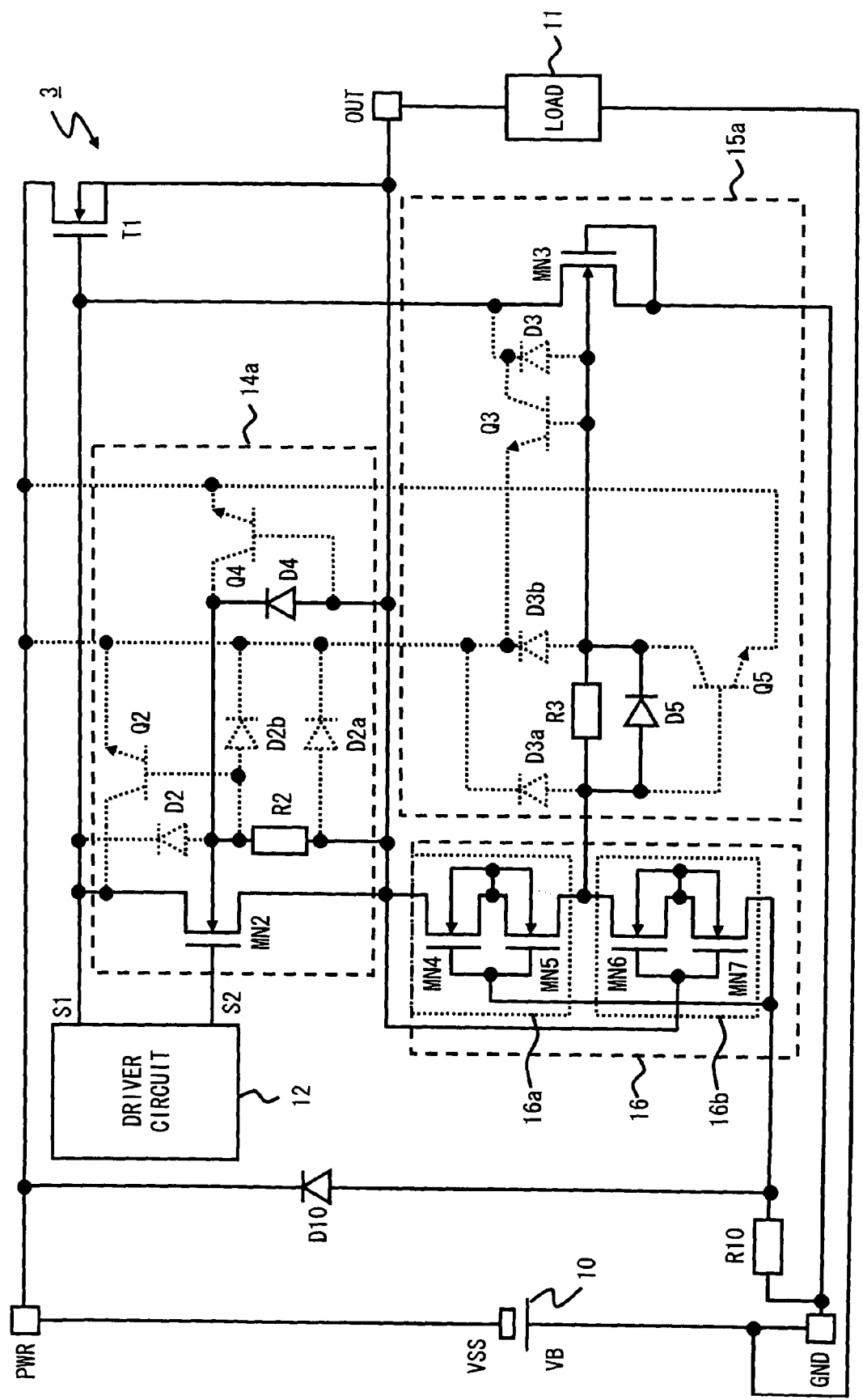
FIG. 9 is a circuit diagram of the load driving device when the power supply is reversely connected according to the second exemplary embodiment.

Next, the load driving device 3 when the power supply 10 is reversely connected will be described. When the power supply 10 is reversely connected, parasitic elements are formed as in the embodiments described above. Then, a circuit diagram of the load driving device 3 when the power supply 10 is reversely connected will be shown in FIG. 9. As shown in FIG. 9, accompanying addition of the diode D4, a parasitic transistor Q4 is formed in the load driving device 3. A base of the parasitic transistor Q4 is connected to an anode of the diode D4. A collector of the parasitic transistor Q4 is connected to a cathode of the diode D4. An emitter of the parasitic transistor Q4 is connected to the power supply terminal PWR. Further, accompanying addition of the diode D5, a parasitic transistor Q5 is formed. A base of the parasitic transistor Q5 is connected to an anode of the diode D5. A collector of the parasitic transistor Q5 is connected to a cathode of the diode D5. An emitter of the parasitic transistor Q5 is connected to the power supply terminal PWR.

Figure 10:
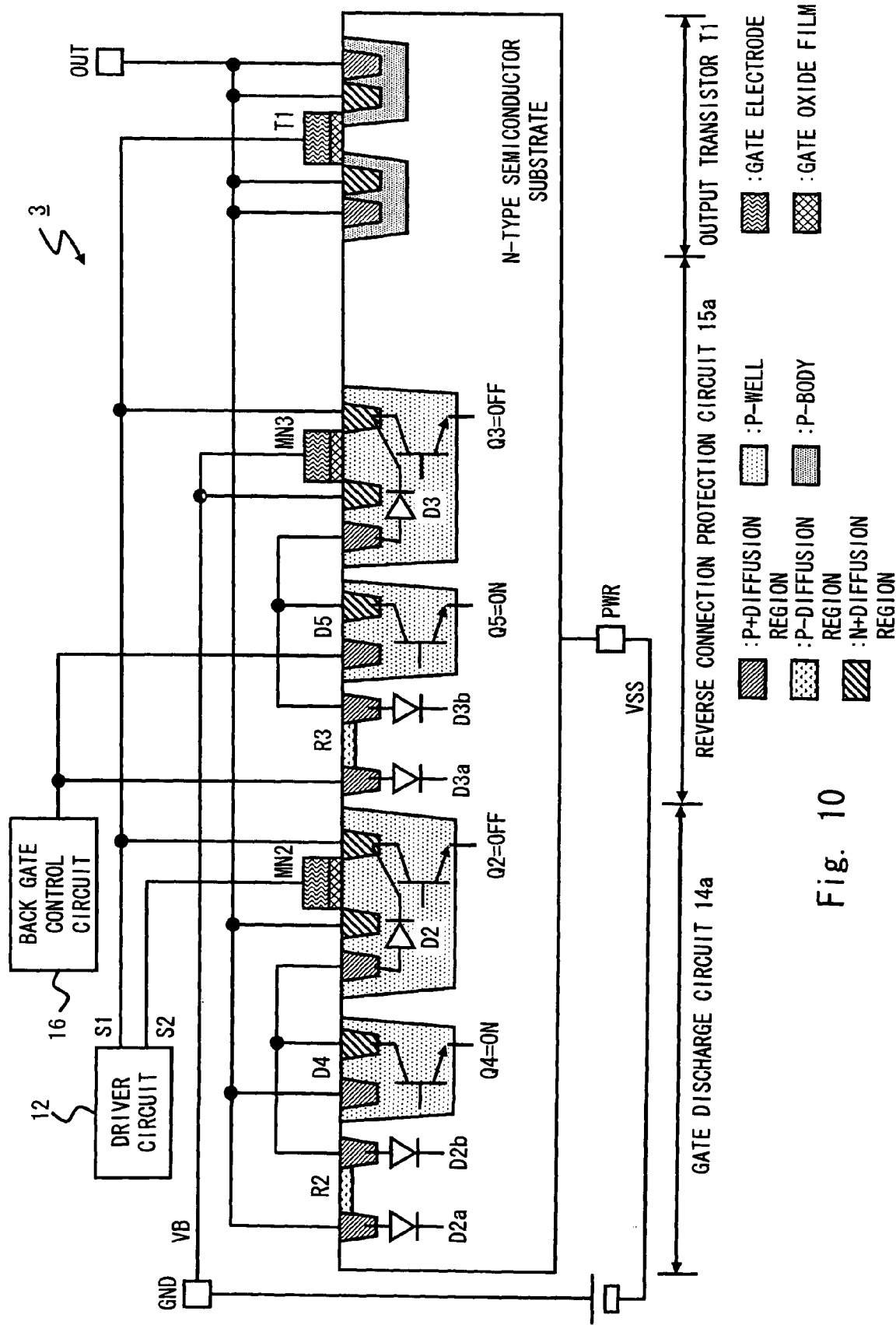
FIG. 10 is a sectional view of a reverse connection protection circuit a the output transistor, and explains about these parasitic elements according to the second exemplary embodiment.

In order to more specifically describe these parasitic elements, a sectional view of the gate discharge circuit 14a, reverse connection protection circuit 15a, and output transistor T1 will be shown in FIG. 10. In the sectional view shown in FIG. 10, an example where the gate discharge circuit 14a, reverse connection protection circuit 15a, and output transistor T1 are formed on one N-type semiconductor substrate is shown.

As shown in FIG. 10, the diode D4 is formed in a region where the gate discharge circuit 14a is formed. The diode D4 includes a P well formed in the N-type semiconductor substrate. Then, in the P well, a P+ diffusion region that serves as an anode side terminal of the diode D4 and an N+ diffusion region that serves as a cathode side terminal of the diode D4 are included. Then, the parasitic transistor Q4 is formed in this diode D4, with the P well configured as a base thereof, with the N+ diffusion region configured as a collector thereof, and with the N-type semiconductor substrate configured as an emitter thereof.

The diode D5 is formed in a region where the reverse connection protection circuit 15a is formed. The diode D5 includes a P well formed in the N-type semiconductor substrate. Then, in the P well, a P+ diffusion region that serves as an anode side terminal of the diode D5 and an N+ diffusion region that serves as a cathode side terminal of the diode D5 are included. Then, the parasitic transistor Q5 is formed in this diode D5, with the P well configured as a base thereof, with the N+ diffusion region configured as a collector thereof, and with the N-type semiconductor substrate configured as an emitter thereof.

Next, an operation of the load driving device 3 when the power supply 10 is reversely connected will be described. The basic operation of load driving device 3 is similar to that of the load driving device 2. However, in the load driving device 3, the parasitic transistors Q4 and Q5 are turned on when the power supply 10 is reversely connected. For this reason, when the power supply 10 is reversely connected, each of a back gate voltage of the discharge transistor MN2 and a back gate voltage of the protection transistor MN3 in the load driving device 3 assumes a value close to a negative-polarity-side voltage VSS of the power supply 10. The parasitic diodes D2 and D3 are not thereby forwardly biased in the load driving device 3. Further, base-to-emitter voltages of the parasitic transistors Q2 and Q3 become smaller than those in the first embodiment, and assume values close to 0V, for example. Accordingly, in the load driving device 3, the parasitic transistors Q2 and Q3 are turned off with more reliability than in the first embodiment.

As described above, when the power supply 10 is reversely connected in the load driving device 3, the parasitic transistors Q4 and Q5 formed in the diodes D4 and D5, respectively, are turned on. The back gates of the discharge transistor MN2 and the protection transistor MN3 thereby assume voltage values close to the negative-polarity-side voltage VSS of the power supply 10. With this arrangement, the parasitic transistors Q2 and Q3 may be turned off with more reliability than in the first embodiment. For this reason, the possibility that the parasitic transistors Q2 and Q3 may operate is lower than those in the first embodiment. Higher reliability may be thereby implemented.

Third Exemplary Embodiment

Figure 11:
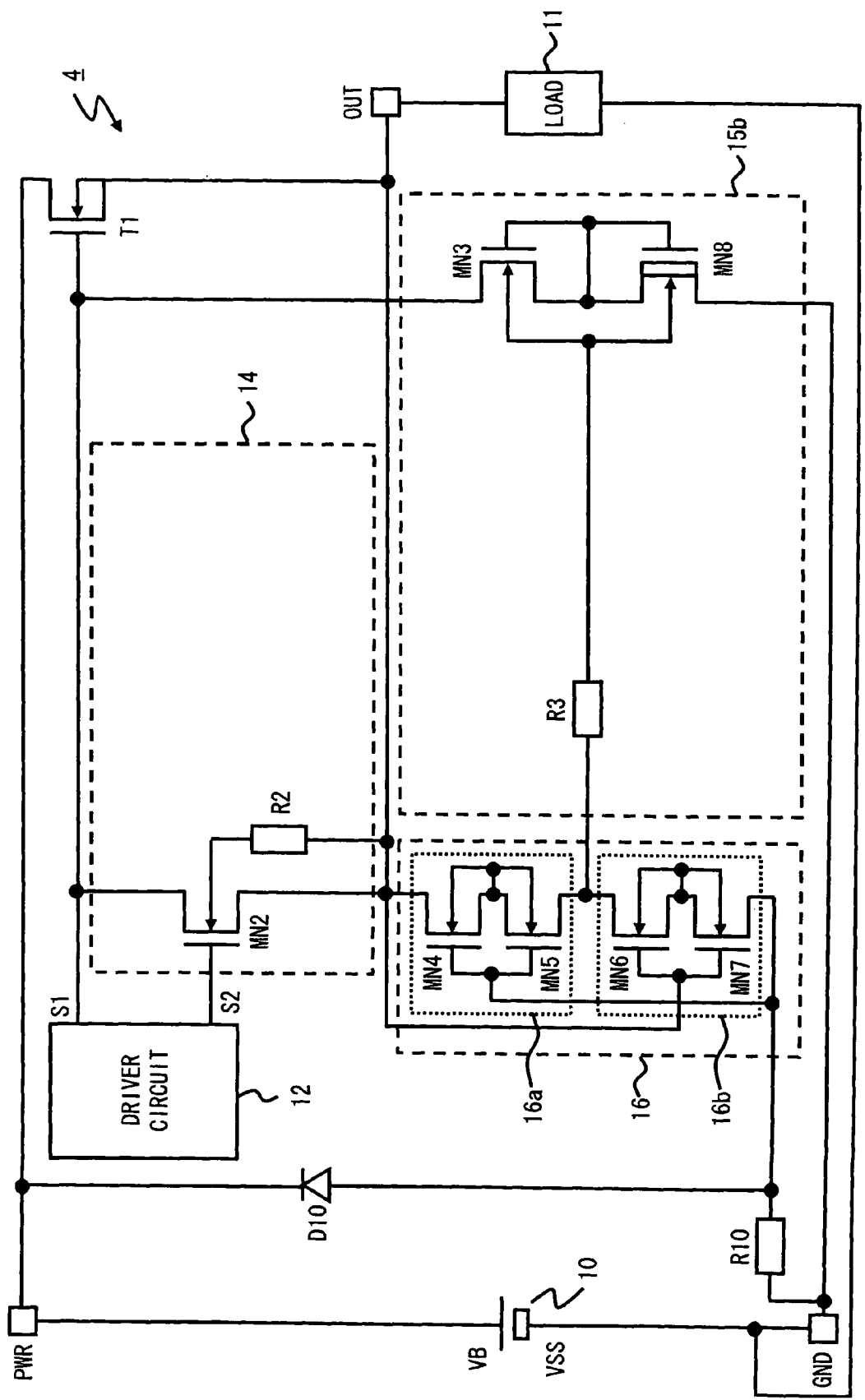
FIG. 11 is a circuit diagram of a load driving device according to a third exemplary embodiment of a present invention.

A circuit diagram of a load driving circuit 4 according to a third embodiment will be shown in FIG. 11. As shown in FIG. 11, the load driving circuit 4 includes a reverse connection protection circuit 15b which shows a variation of the reverse connection protection circuit 15 in the first embodiment. In the load driving device 4, by assigning same reference numerals to components that are the same as those of the load driving device 2, description of the components will be omitted.

The reverse connection protection circuit 15b is obtained by adding a depletion-type NMOS transistor MN8 to the reverse connection protection circuit 15. The depletion-type NMOS transistor MN8 is connected between the protection transistor MN3 and the ground terminal GND. A gate of the depletion-type NMOS transistor MN8 is connected to the gate of the protection transistor MN3, and a back gate of the depletion-type NMOS transistor MN8 is connected to the back gate of the protection transistor MN3.

Figure 12:
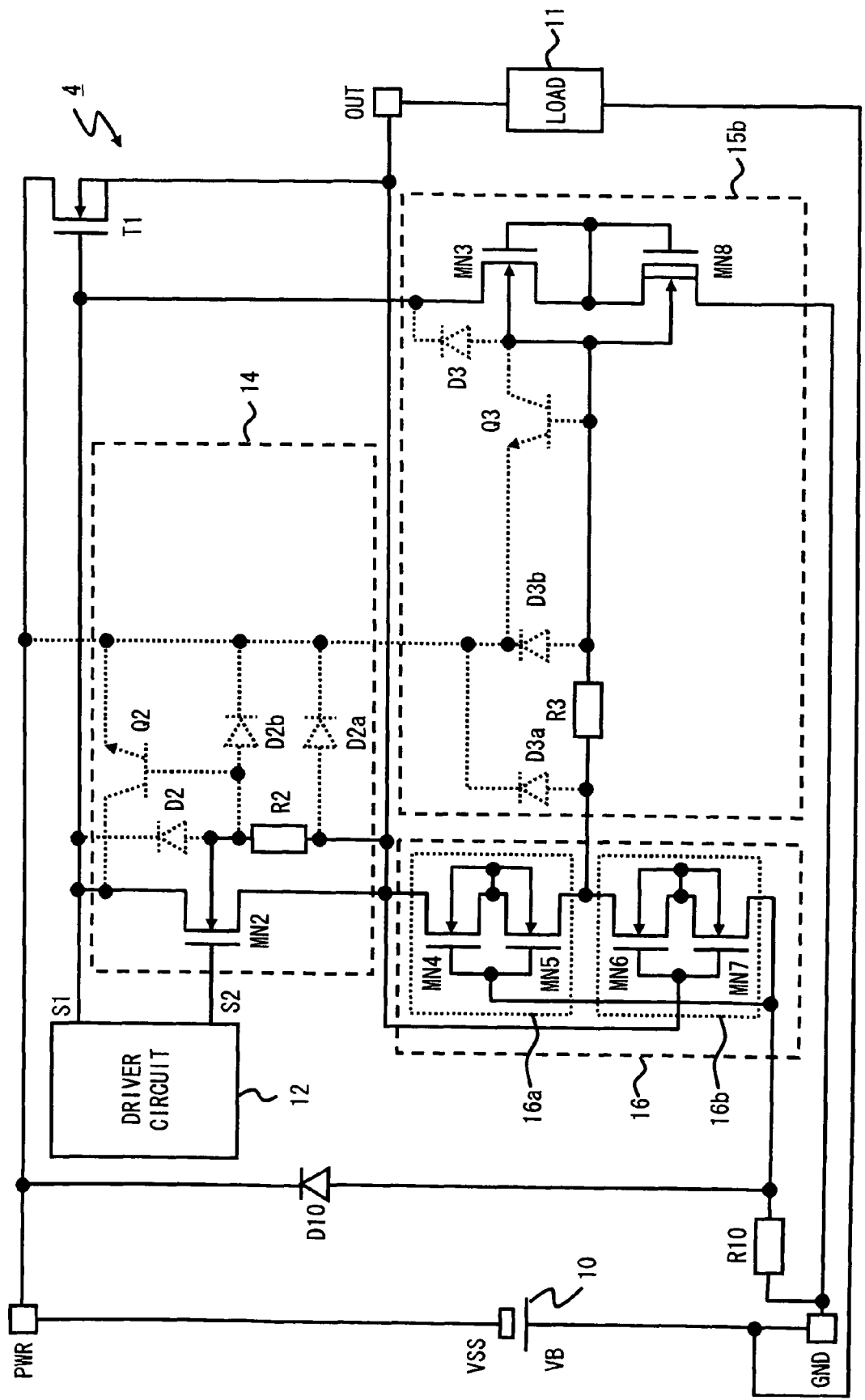
FIG. 12 is a circuit diagram of the load driving device when the power supply is reversely connected according to the third exemplary embodiment.

Since an operation of the load driving device 4 when the power supply 10 is normally connected is the same as that of the load driving device 2, description of the operation will be omitted. When the power supply 10 is reversely connected, parasitic elements are formed in the load driving device 4, as in the embodiments described above. A circuit diagram of the load driving device 4 when the power supply 10 is reversely connected will be shown in FIG. 12. As shown in FIG. 12, the circuit diagram of the load driving device 4 when the power supply 10 is reversely connected is obtained by adding the depletion-type NMOS transistor MN8 to the circuit diagram of the load driving device 2 shown in FIG. 6. Thus, description of the circuit diagram of the load driving device 4 when the power supply 10 is reversely connected will be omitted.

Figure 13:
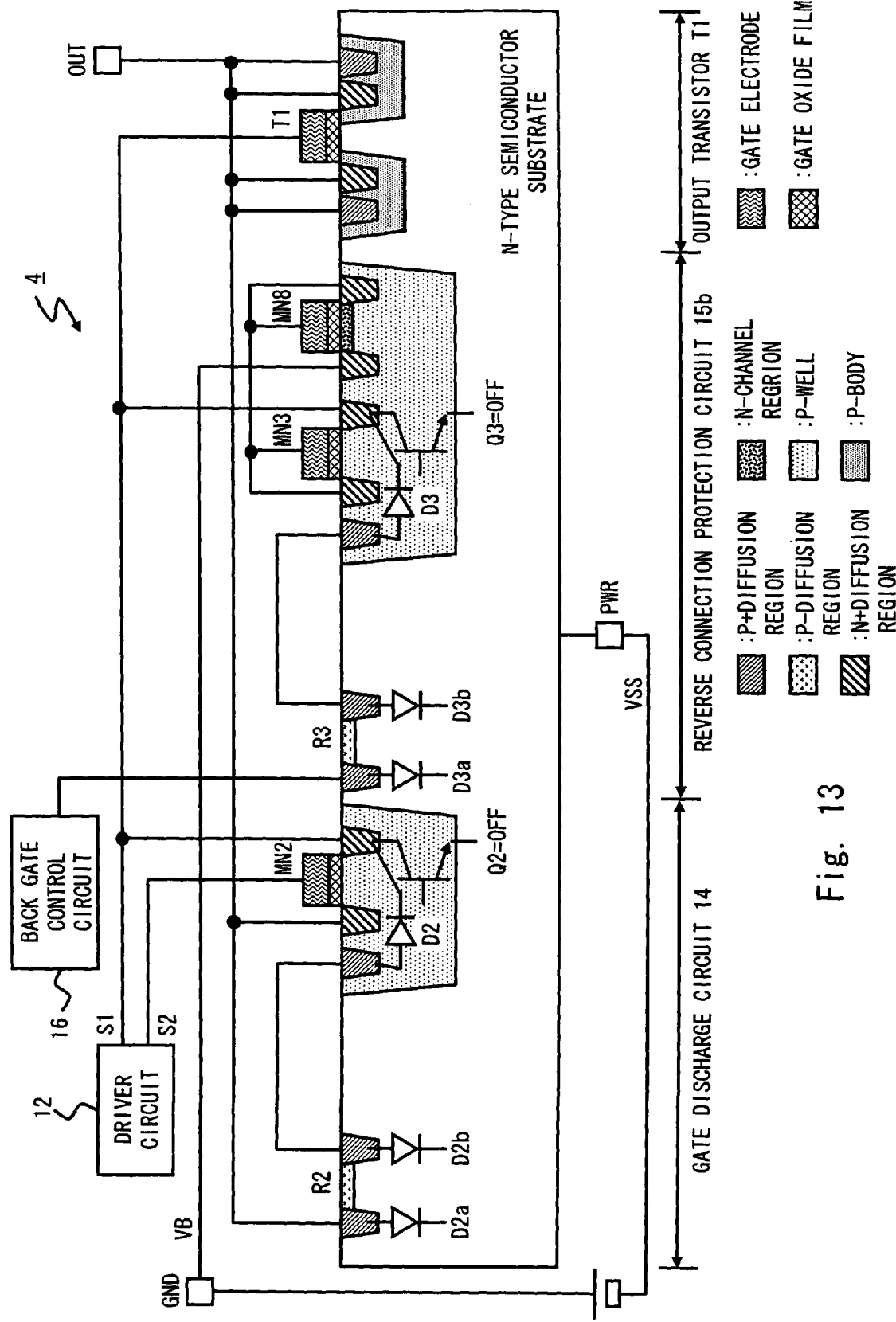
FIG. 13 is a sectional view of a reverse connection protection circuit and an output transistor, and explains about these parasitic elements according to the third exemplary embodiment.

Next, a sectional view of the gate discharge circuit 14, reverse connection protection circuit 15b, and output transistor T1 in the load driving device 4 will be shown in FIG. 13. The sectional view in FIG. 13 shows an example where the gate discharge circuit 14, reverse connection protection circuit 15b, and output transistor T1 are formed on one N-type semiconductor substrate. As shown in FIG. 13, the depletion-type NMOS transistor MN8 is formed in the P well where the protection transistor MN3 is formed. The depletion-type NMOS transistor MN8 includes two N+ diffusion regions each of which serves as a source or drain region. Further, in a region between the two N+ diffusion regions in the vicinity of a substrate surface, an N channel region made of an N-type semiconductor is formed. Further, a gate electrode is formed above an upper layer of the substrate between the two N+ diffusion regions via a gate oxide film.

Next, an operation of the load driving device 4 when the power supply 10 is reversely connected will be described. The operation of the load driving device 4 in this case is substantially the same as that of the load driving device 2. However, when the power supply 10 is reversely connected, the depletion-type NMOS transistor MN8 in the load driving device 4 operates as a constant current source.

When the depletion-type transistor MN8 is not present, a large current instantaneously flows through the output transistor T1 from the ground terminal GND via the protection transistor MN3. For this reason, the size of the protection transistor MN3 in the first and second embodiments needs to be large so that the large current may flow therethrough. In the load driving device 4, however, the depletion-type NMOS transistor MN8 is operated as the constant current source. An amount of the current that flows through the protection transistor MN3 may be thereby controlled. With this arrangement, the size of the protection transistor MN3 in the load driving device 4 may be designed to be smaller than in the load driving device in each of the first and second embodiments. It means that, by reducing the circuit area of the protection transistor MN3 in the load driving device 4, the area of a chip where the load driving device 4 is formed may be reduced.

Fourth Exemplary Embodiment

Figure 14:
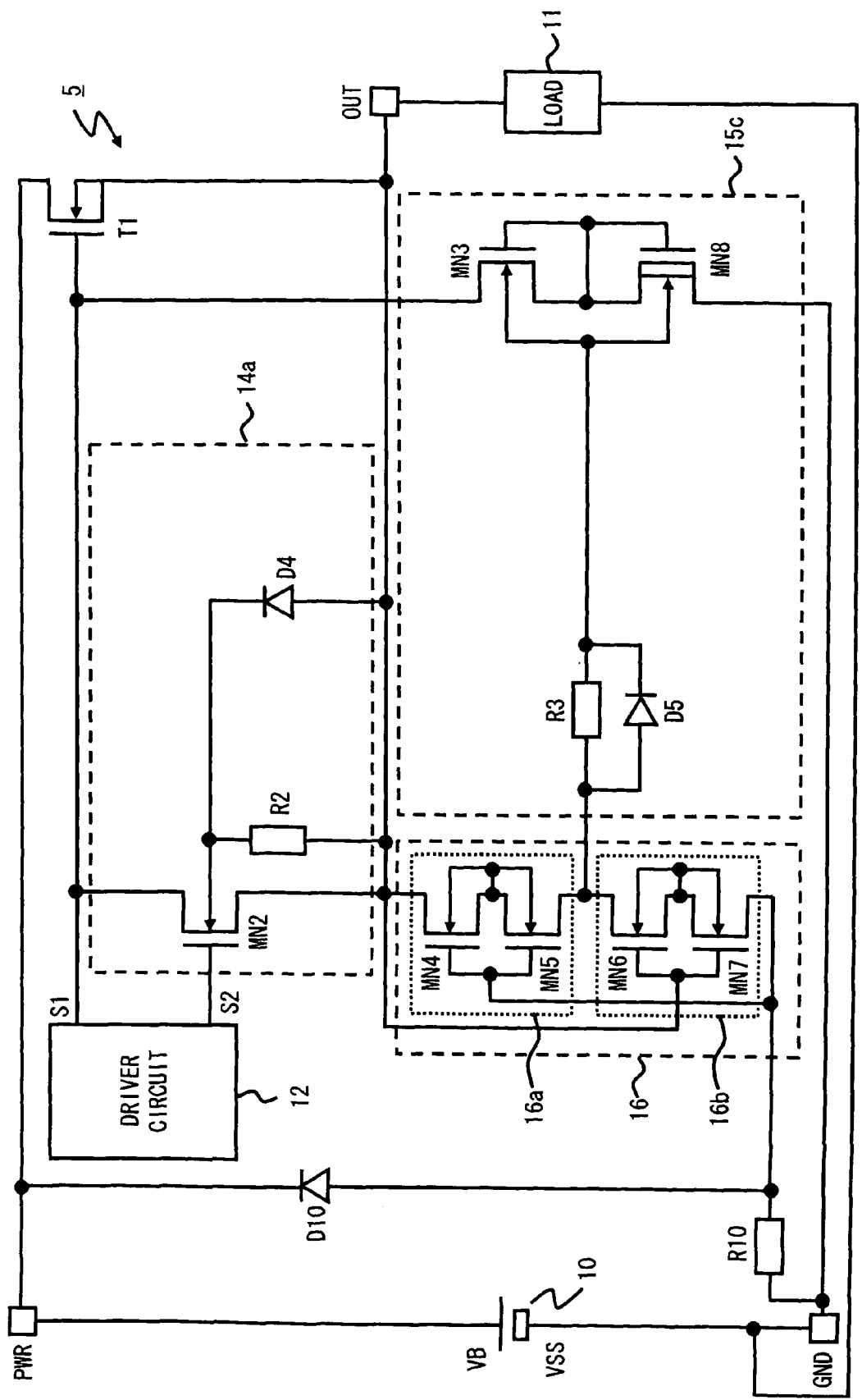
FIG. 14 is a circuit diagram of a load driving device according to a fourth exemplary embodiment of a present invention.

A circuit diagram of a load driving device 5 according to a fourth embodiment will be shown in FIG. 14. As shown in FIG. 14, the load driving device 5 includes a reverse connection protection circuit 15c that shows a variation of the reverse connection protection circuit 15a in the second embodiment. In the load driving device 5, by assigning same reference numerals to components that are the same as those of the load driving device 3, description of the components will be omitted. The reverse connection protection circuit 15c is obtained by adding the depletion-type NMOS transistor MN8 used in the third embodiment to the reverse connection protection circuit 15a. Connection of the depletion type NMOS transistor MN8 is the same that in the third embodiment.

Figure 15:
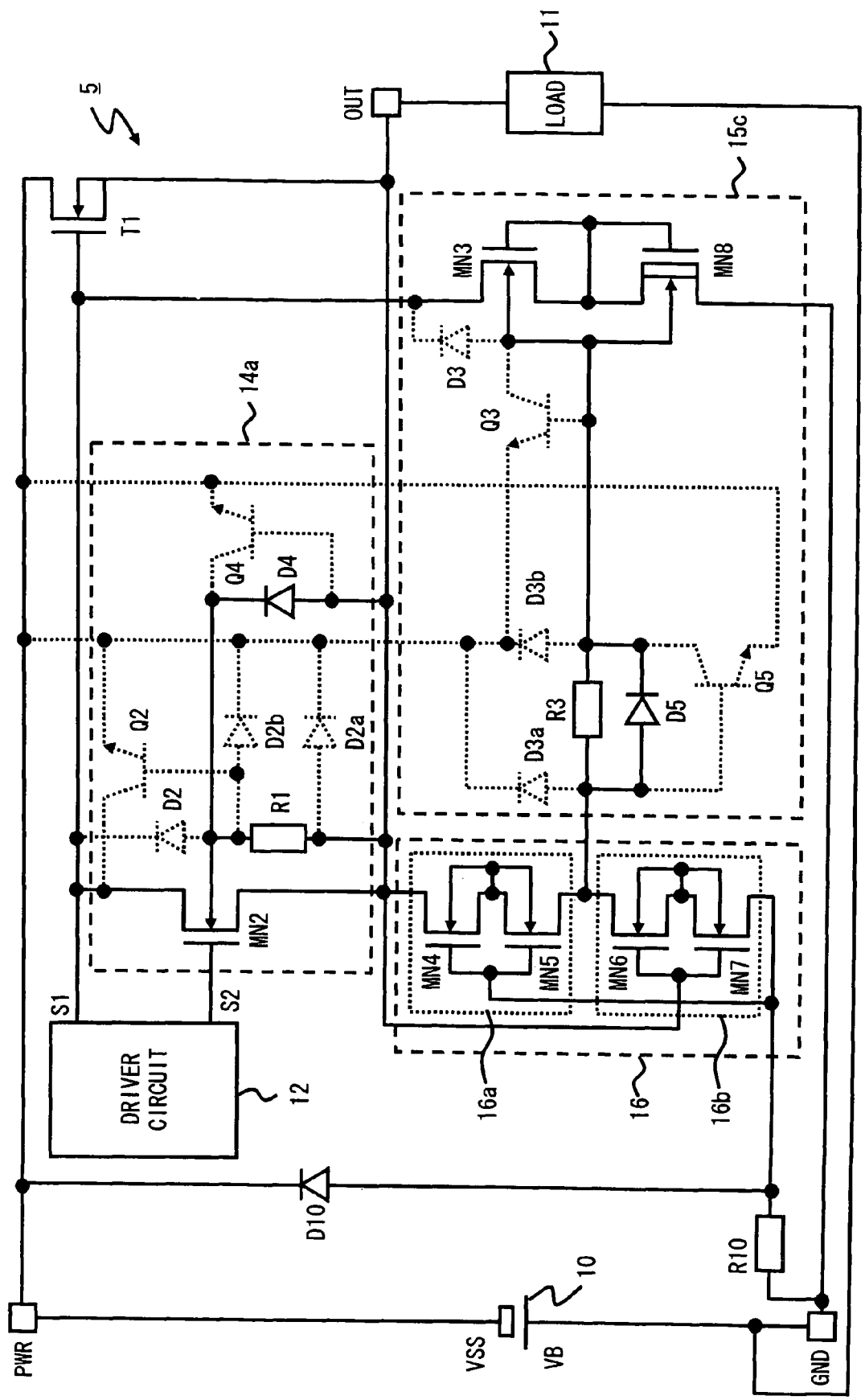
FIG. 15 is a circuit diagram of the load driving device when the power supply is reversely connected according to the fourth exemplary embodiment.
Figure 16:
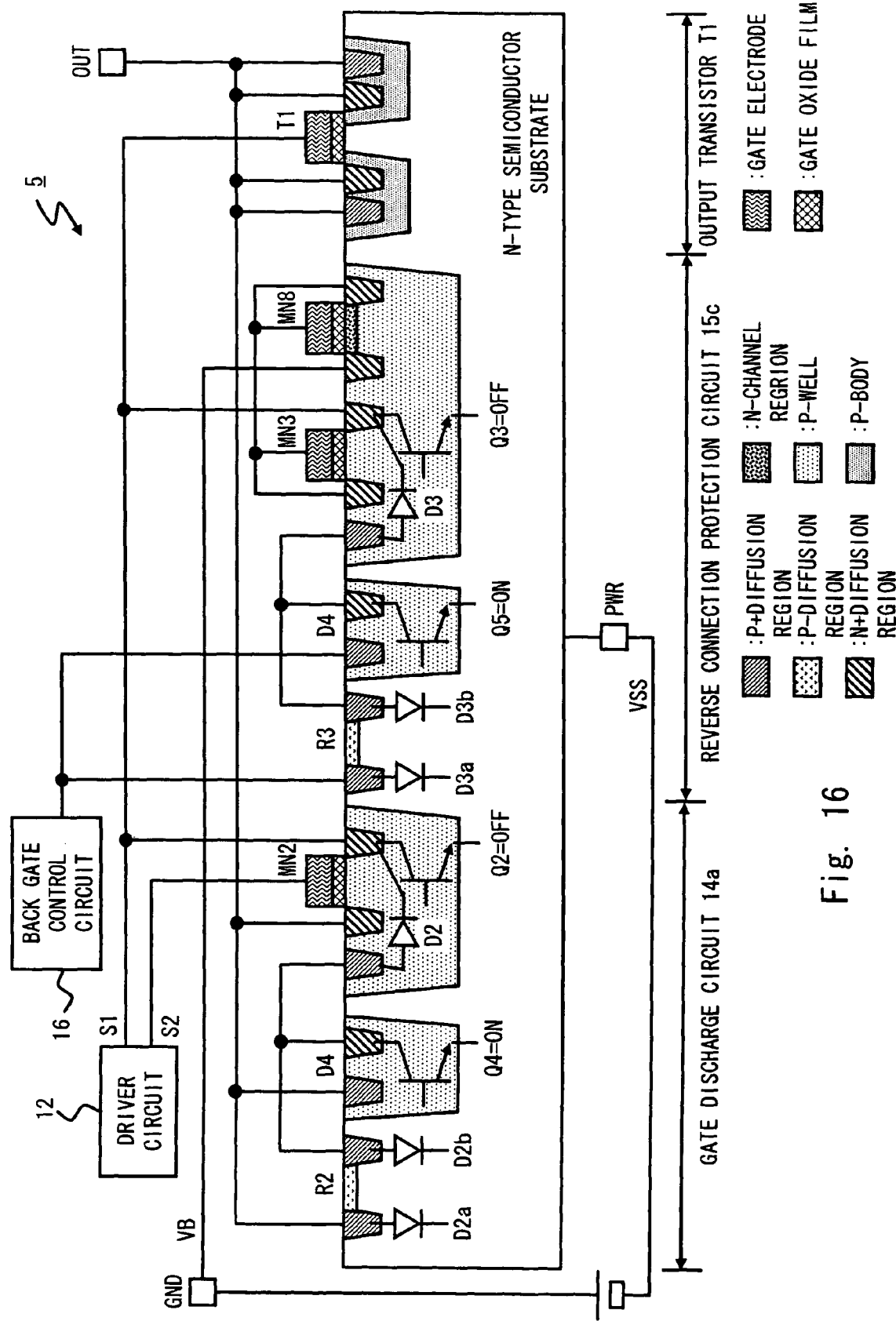
FIG. 16 is a sectional view of a reverse connection protection circuit and an output transistor, and explains about these parasitic elements according to the fourth exemplary embodiment.
Figure 17:
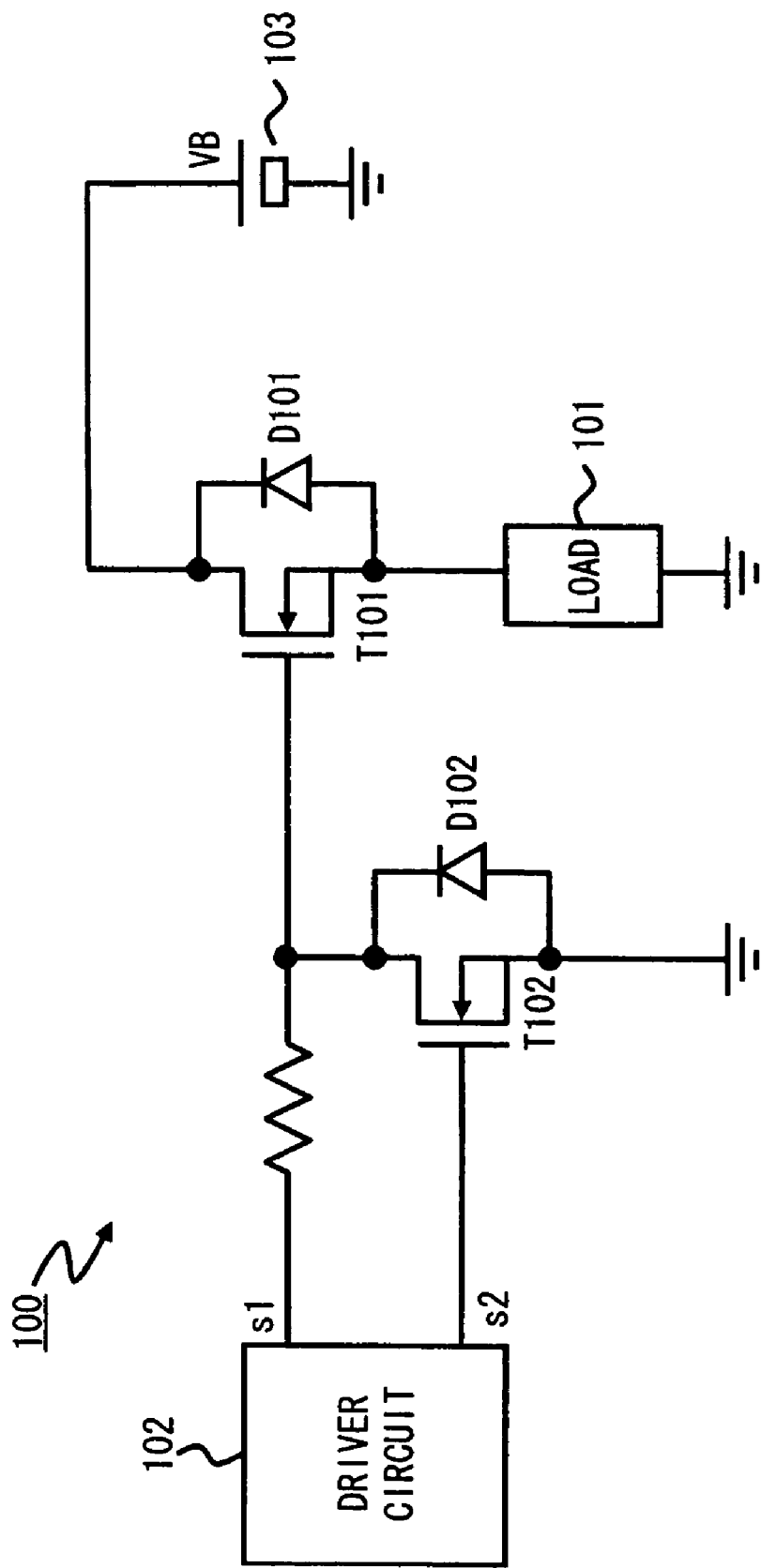
FIG. 17 is a circuit diagram of a load driving device according to a prior art.
Figure 18:
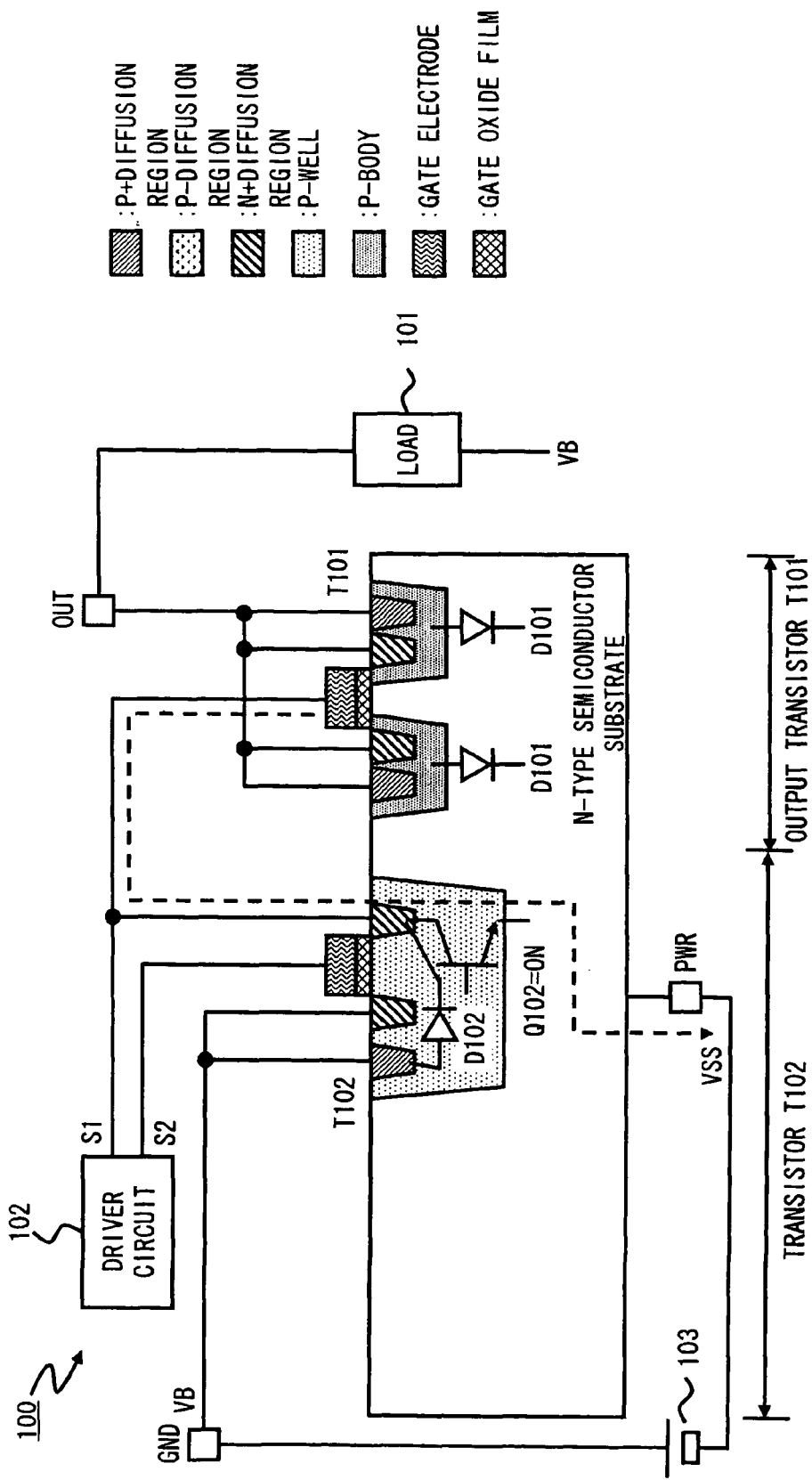
FIG. 18 is a sectional view of a load driving device, and explains about problem of the load driving device according to the prior art.

Since an operation of the load driving device 5 when the power supply 10 is normally connected is the same as that of the load driving device 3 in the second embodiment, description of the operation will be omitted. When the power supply 10 is reversely connected, parasitic elements are formed in the load driving device 5, as in the embodiments described above. A circuit diagram of the load driving device 5 when the power supply 10 is reversely connected will be shown in FIG. 15. As shown in FIG. 15, the circuit diagram of the load driving device 5 when the power supply 10 is reversely connected is obtained by adding the depletion-type NMOS transistor MN8 to the circuit diagram of the load driving device 3 shown in FIG. 9. Thus, description of the circuit diagram will be omitted. Further, a sectional view of the gate discharge circuit 14a, reverse connection protection circuit 15c, and output transistor T1 of the load driving device 5 will be shown in FIG. 16. The sectional view in FIG. 16 shows an example where the gate discharge circuit 14a, reverse connection protection circuit 15c, and output transistor T1 are formed on one N-type semiconductor substrate. As shown in FIG. 16, the depletion-type NMOS transistor MN8 in the load driving device 5 is the same as that shown in FIG. 13. Thus, description of the depletion-type NMOS transistor MN8 will be omitted.

In the load driving device 5 as well, the depletion-type NMOS transistor MN8 operates as a constant current source that controls current which flows through the protection transistor MN3 when the power supply 10 is reversely connected. For this reason, the size of the protection transistor MN3 in the load driving device 5 may be designed to be smaller than in the load driving device 3. It means that, by reducing the circuit area of the protection transistor MN3 in the load driving device 5, the area of a chip where the load driving device 5 is formed may be reduced.

In each of the embodiments described above, the description was directed to the example where the gate discharge circuit, reverse connection protection circuit, and output transistor are formed on one semiconductor substrate. In the present invention, the protection transistor and the diffusion resistors may be formed on one semiconductor substrate. It means that the present invention is not limited to a configuration where the gate discharge circuit, reverse connection protection circuit, and output transistor are formed on one semiconductor substrate.

The first to fourth exemplary embodiments can be combined as desirable by one of ordinary skill in the art. The output transistor T1 and/or the MOS transistors may have a trench-gate-structure instead of the above mentioned gate-structure.

While the invention has been described in terms of several exemplary embodiments, those skilled in the art will recognize that the invention can be practiced with various modifications within the spirit and scope of the appended claims and the invention is not limited to the examples described above.

Further, the scope of the claims is not limited by the exemplary embodiments described above.

Furthermore, it is noted that, Applicant's intent is to encompass equivalents of all claim elements, even if amended later during prosecution.

What is claimed is:

1. A load driving device comprising:
    an output transistor formed in a semiconductor substrate of a first conductivity type, the output transistor being connected between a first power supply terminal and an output terminal, the output terminal being configured to be connected to a load; and
    a protection transistor connected between a gate of the output transistor and a second power supply terminal, the protection transistor being formed in a well region of a second conductivity type formed in the same semiconductor substrate, the well region corresponding to a back gate of the protection transistor, the protection transistor turning on the output transistor when a polarity of a power supply connected between the first and second power supply lines is reversed.

2. The load driving device according to claim 1, further comprising:
    a back gate control circuit outputting a voltage based upon the polarity of the first and second power supply terminals at an output node thereof; and
    a diffusion resistor formed in the same semiconductor substrate and connected between the output node of the back gate control circuit and the back gate of the protection transistor.

3. The load driving device according to claim 1, wherein the semiconductor substrate comprises an N-type semiconductor substrate.

4. The load driving device according to claim 1, further comprising:
    a clamp diode and a current restriction resistor connected between the first and second power supply terminals, a cathode and an anode of the clamp diode being connected to the first power supply terminal and the current restriction resistor, respectively,
    wherein the back gate control circuit is connected between the output terminal and a node between the anode of the clamp diode and the current restriction resistor.

5. The load driving device according to claim 4, wherein
    the protection transistor comprises a parasitic diode with the back gate of the protection transistor configured as an anode thereof and with a diffusion region of the protection transistor connected to the gate of the output transistor configured as a cathode thereof; and
    when the polarity of the power supply connected between the first and second power supply terminals is reversed, a voltage from the second power supply terminal is applied to the gate of the output transistor via the resistor and the parasitic diode.

6. The load driving device according to claim 2, wherein
    the back gate control circuit that supplies a voltage corresponding to a voltage of the second power supply terminal to the back gate of the protection transistor when the power supply connected between the first and second power supply terminals is normally connected, and supplies a voltage corresponding to a voltage of the first power supply terminal to the back gate of the protection transistor when the polarity of the power supply is reversed.

7. The load driving device according to claim 2, further comprising a diode connected in parallel with the diffusion resistor so that a cathode of the diode is connected to the back gate of the protection transistor.

8. The load driving device according to claim 6, further comprising:
   a depletion-type transistor formed on the semiconductor substrate and connected between the protection transistor and the second power supply terminal, a back gate of the depletion-type transistor and the back gate of the protection transistor being connected in common, a gate of the depletion-type transistor and a gate of the protection transistor being connected in common.

9. The load driving device according to claim 2, wherein the diffusion resistor is defined as a first diffusion resistor, the load driving device further comprising:
   a discharge transistor formed in the semiconductor substrate and provided between the gate of the output transistor and a source of the output transistor, the discharge transistor causing a short circuit between the gate and the source of the output transistor when the output transistor is turned off; and
   a second diffusion resistor formed on the semiconductor substrate and connected between a back gate of the discharge transistor and the source of the output transistor.

10. The load driving device according to claim 9, further comprising:
    a protection diode connected to the second diffusion resistor in parallel.

11. The load driving device according to claim 1, wherein the output transistor comprises a vertical MOS transistor, and
    the protection transistor comprises a lateral MOS transistor.

12. A load driving device with elements formed on a semiconductor substrate of one conductivity type, said load driving device comprising:
    an output transistor connected between a first power supply terminal and an output terminal, to drive an external load via the output terminal;
    a protection transistor connected between a gate of the output transistor and a second power supply terminal, the protection transistor turning on the output transistor when a polarity of a power supply connected between the first and second power supply terminals is reversed;
    a clamp diode and a resistor connected between the first and second power supply terminals, a cathode and an anode of the clamp diode being connected to the first power supply terminal and the resistor, respectively; and
    a diffusion resistor connected between a back gate of the protection transistor and a node between the anode of the clamp diode and the resistor, which supplies a voltage to the back gate of the protection transistor.

13. The load driving device of claim 12, wherein a first end of the diffusion resistor is connected to the back gate of the protection transistor and a second end of the diffusion resistor is connected to the node between the anode of the clamp diode and the resistor via a back gate control circuit which is not outputting a voltage based upon the polarity of the first and second power supply terminals to the diffusion resistor.

14. The load driving device of claim 12, further comprising a diode connected in parallel with the diffusion resistor so that a cathode of the diode is connected to the back gate of the protection transistor.

15. The load driving device of claim 14, further comprising a depletion-type transistor connected between the protection transistor and the second power supply terminal, a back gate of the depletion-type transistor and the back gate of the protection transistor being connected in common, a gate of the depletion-type transistor and a gate of the protection transistor being connected in common.

16. A load driving device, comprising:
    an output transistor connected between a first power supply line and an output terminal, the output transistor being configured to drive a load connected between the output terminal and a second power supply line;
    a reverse connection protection circuit interconnected between the gate of the output transistor and the second power supply line, the reverse connection protection circuit serving as a forwardly-biased diode between the second power supply line and the gate of the output transistor during a reverse power supply condition, thereby turning on the output transistor during the reverse power supply condition, the reverse connection protection circuit comprising a MOS transistor;
    a back gate control circuit outputting a voltage based upon a polarity of the first and second power supply lines; and
    a resistor interconnected between the back gate control circuit and a backgate of the transistor.

17. The load driving device of claim 16, wherein:
    the MOS transistor comprises a source and a drain interconnected between the gate of the output transistor and the second power supply line; and
    the back gate control circuit comprises a first switch interconnected between the output terminal and the resistor and a second switch interconnected between the second power supply line.

18. The load driving device of claim 17, wherein the reverse connection protection circuit further comprises a diode connected in parallel to the resistor interconnected between the back gate of the MOS transistor and the back gate control circuit switches.

19. The load driving device of claim 16, wherein the MOS transistor is defined as a first MOS transistor, the reverse connection protection circuit further comprising a second MOS transistor, the first and second MOS transistors being serially interconnected between the gate of the output transistor and the second power supply line, and back gates of both the first and second MOS transistors being connected to the resistor connected to the switches of the back gate control circuit.

* * * * *